(12) United States Patent
Wang et al.

(10) Patent No.: US 11,587,621 B1
(45) Date of Patent: Feb. 21, 2023

(54) FOGGY-FINE PROGRAMMING FOR MEMORY CELLS WITH REDUCED NUMBER OF PROGRAM PULSES

(71) Applicant: Western Digital Technologies, Inc., San Jose, CA (US)

(72) Inventors: Ming Wang, Shanghai (CN); Liang Li, Shanghai (CN); Bruce Li, Shanghai (CN); Will Li, Shanghai (CN); Yichen Wang, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/395,018

(22) Filed: Aug. 5, 2021

(51) Int. Cl.
| | | |
|---|---|---|
| G11C 16/04 | (2006.01) | |
| G11C 16/10 | (2006.01) | |
| G11C 16/24 | (2006.01) | |
| G11C 16/08 | (2006.01) | |
| H01L 27/11582 | (2017.01) | |
| H01L 27/11565 | (2017.01) | |

(52) U.S. Cl.
CPC .......... *G11C 16/10* (2013.01); *G11C 16/0483* (2013.01); *G11C 16/24* (2013.01); *G11C 16/08* (2013.01); *H01L 27/11565* (2013.01); *H01L 27/11582* (2013.01)

(58) Field of Classification Search
CPC ..... G11C 16/10; G11C 16/0483; G11C 16/24; G11C 16/08; H01L 27/11565; H01L 27/11582
USPC ................................................... 365/185.18
See application file for complete search history.

(56) References Cited

U.S. PATENT DOCUMENTS

| | | | |
|---|---|---|---|
| 7,177,199 B2 * | 2/2007 | Chen ................. | G11C 16/3454 365/185.11 |
| 8,310,870 B2 | 11/2012 | Dutta et al. | |
| 9,530,504 B2 * | 12/2016 | Lei ..................... | G11C 16/0483 |
| 9,711,211 B2 | 7/2017 | Masuduzzaman et al. | |

(Continued)

FOREIGN PATENT DOCUMENTS

WO  WO2020/214217 A1  10/2020

OTHER PUBLICATIONS

U.S. Appl. No. 17/116,579, filed Dec. 9, 2020.

(Continued)

*Primary Examiner* — Tha-O H Bui
(74) *Attorney, Agent, or Firm* — Vierra Magen Marcus LLP

(57) ABSTRACT

Apparatuses and techniques are described for programming memory cells with a reduced number of program pulses. A program operation includes a first, foggy program pass followed by a second, fine program pass. The number of program loops in the foggy program pass is minimized while providing relatively narrow Vth distributions for the foggy states. The program loops include one or more checkpoint program loops in which a program speed of the memory cells is determined through a read operation. In a next program loop, the fast-programming memory cells are inhibited from programming while the slow-programming memory cells are programmed with a reduced speed by applying a program speed-reducing bit line voltage. This brings the threshold voltage of the slow-programming memory cells into alignment with the threshold voltage of the fast-programming memory cells.

20 Claims, 21 Drawing Sheets

(56) References Cited

U.S. PATENT DOCUMENTS

| | | | |
|---|---|---|---|
| 9,830,983 B1* | 11/2017 | Hara | G11C 16/24 |
| 10,811,109 B2 | 10/2020 | Baraskar et al. | |
| 10,861,557 B2* | 12/2020 | Kondo | G11C 16/0483 |
| 2020/0303025 A1 | 9/2020 | Yang et al. | |
| 2020/0312414 A1 | 10/2020 | Baraskar et al. | |

OTHER PUBLICATIONS

International Search Report & The Written Opinion of the International Searching Authority dated Oct. 31, 2022, International Application No. PCT/US2022/027541.

* cited by examiner

Fig. 1A
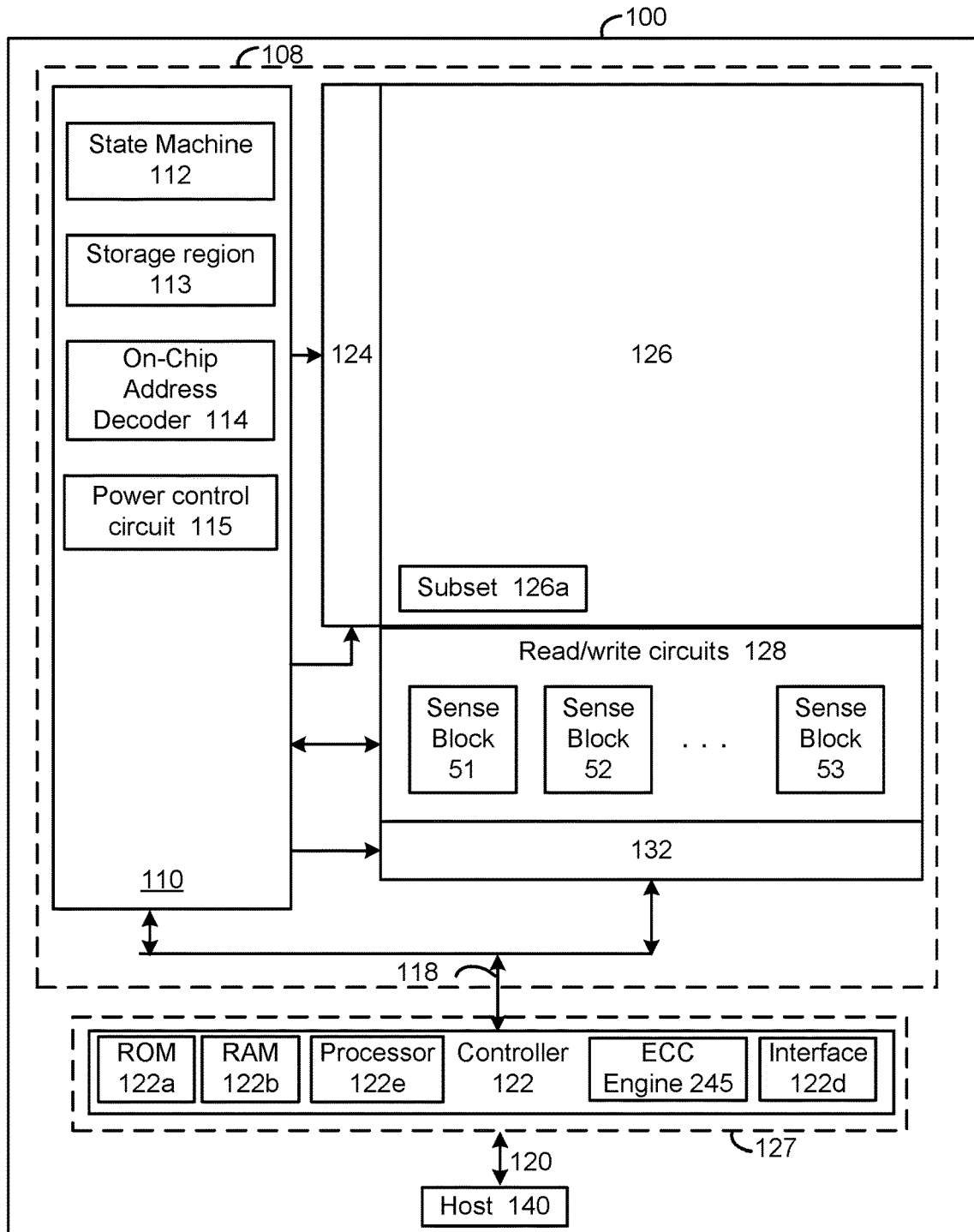
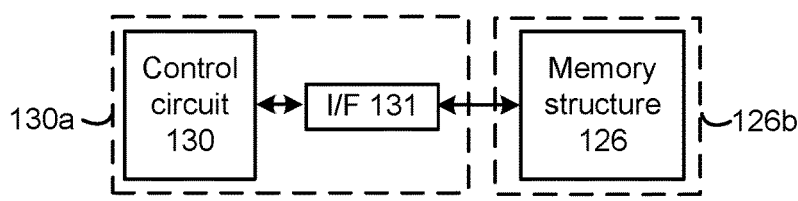
Fig. 1B

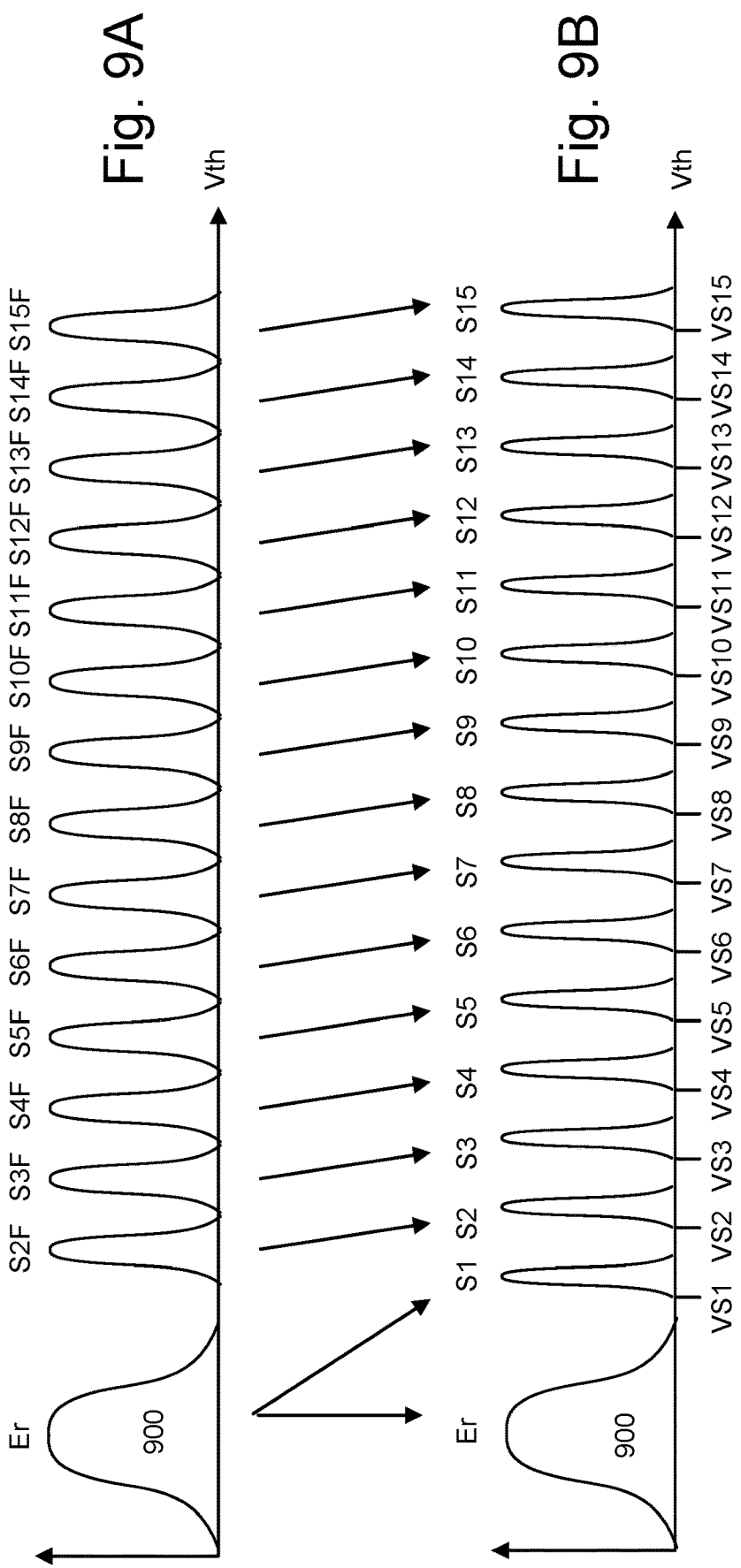

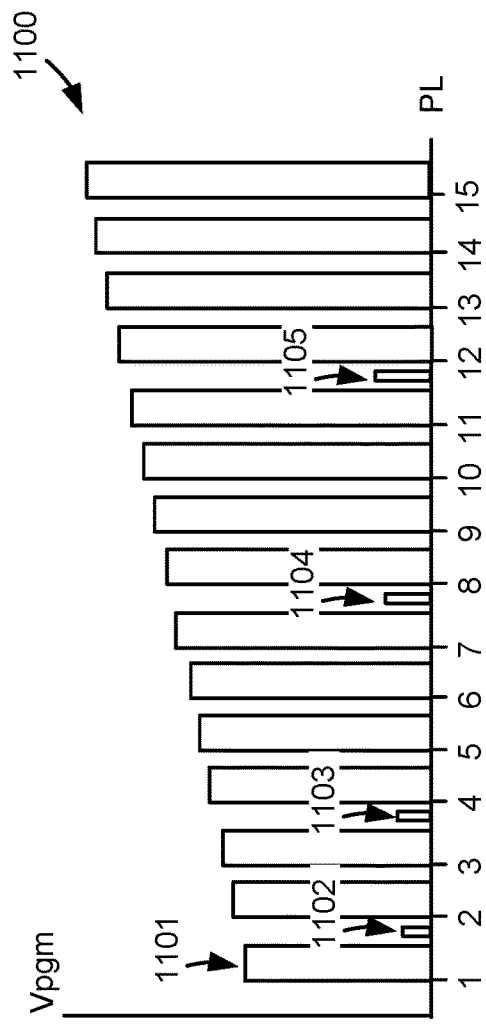
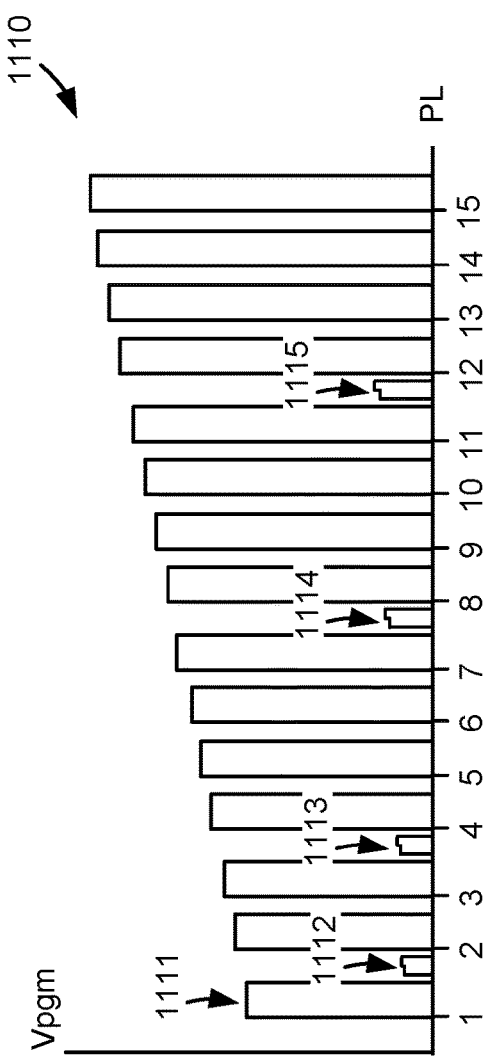

| Page | Er/S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 0 | 0 | 0 | 0 | 1 | 1 | 1 | 1 | 0 | 0 | 1 | 0 | 1 | 0 | 0 |
| UP | 1 | 1 | 0 | 0 | 1 | 1 | 1 | 1 | 0 | 0 | 0 | 0 | 1 | 1 | 1 | 0 |
| MP | 1 | 1 | 1 | 1 | 0 | 0 | 0 | 0 | 0 | 1 | 0 | 1 | 0 | 1 | 1 | 1 |
| LP | 1 | 1 | 1 | 1 | 1 | 1 | 0 | 1 | 1 | 0 | 0 | 0 | 0 | 0 | 0 | 0 |

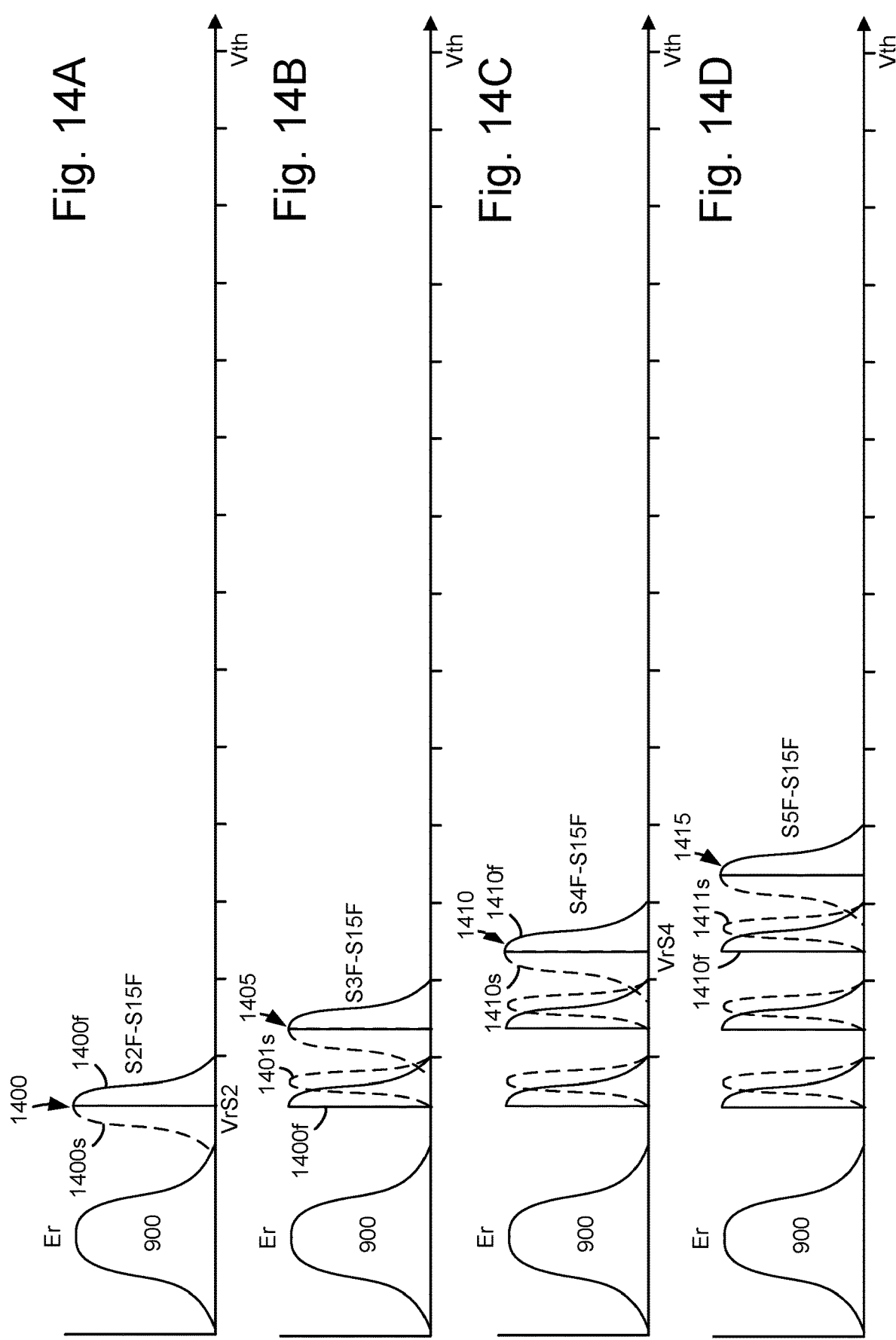

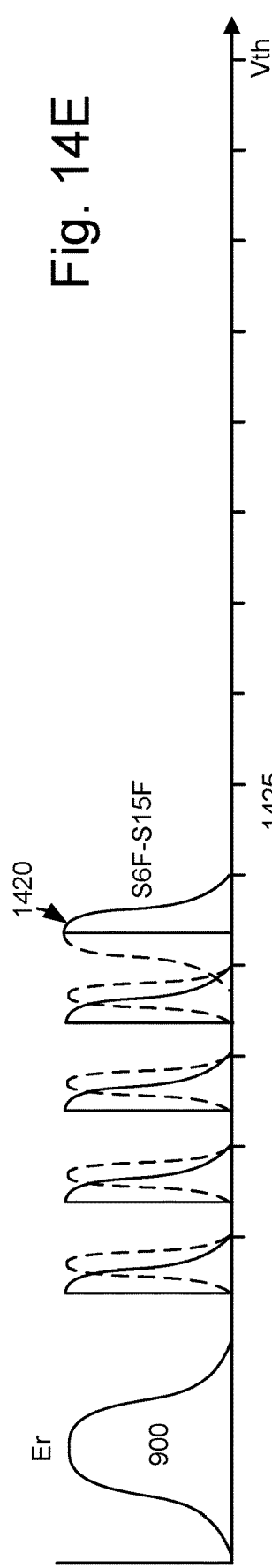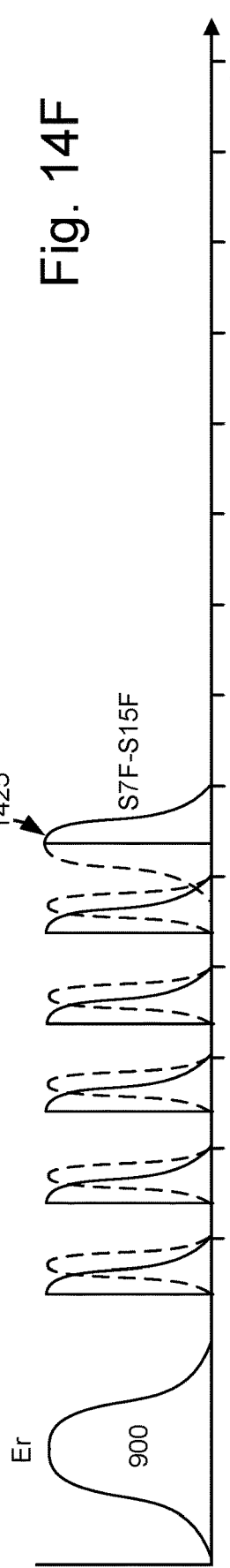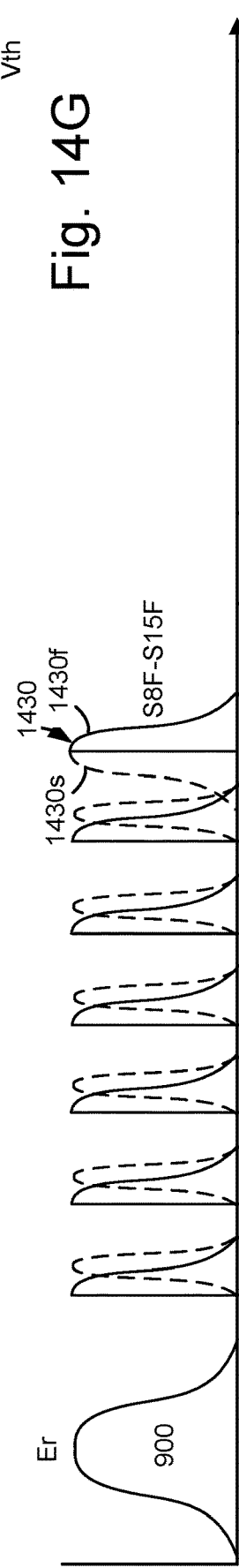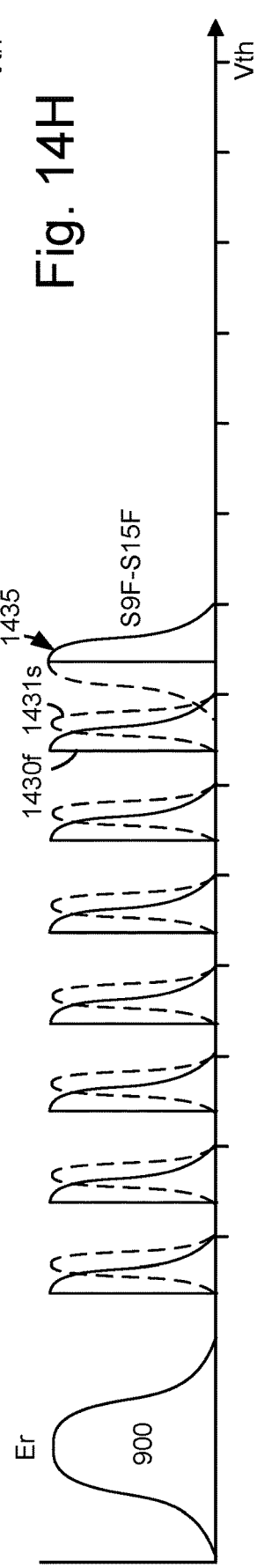

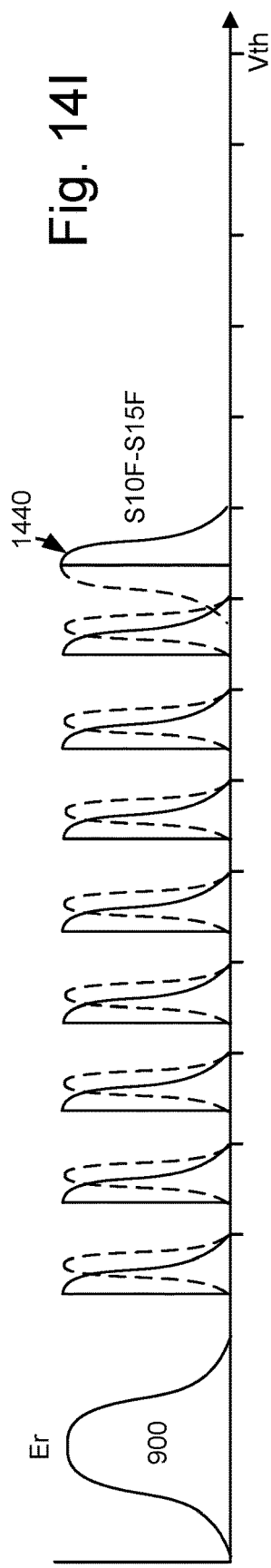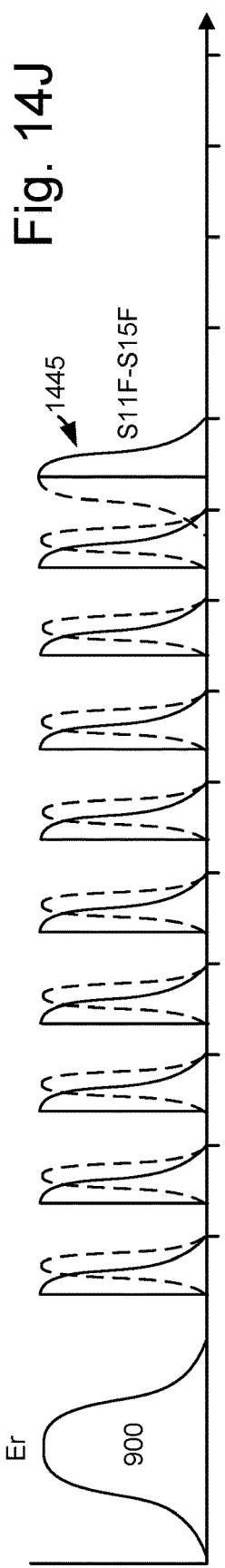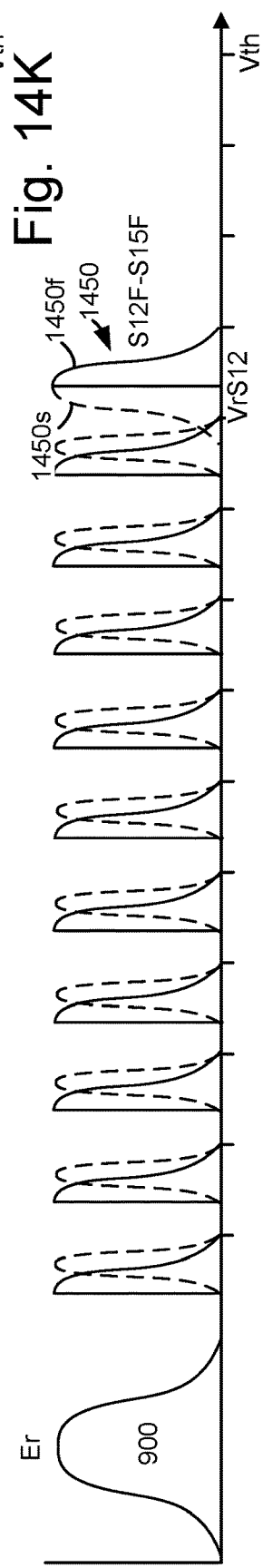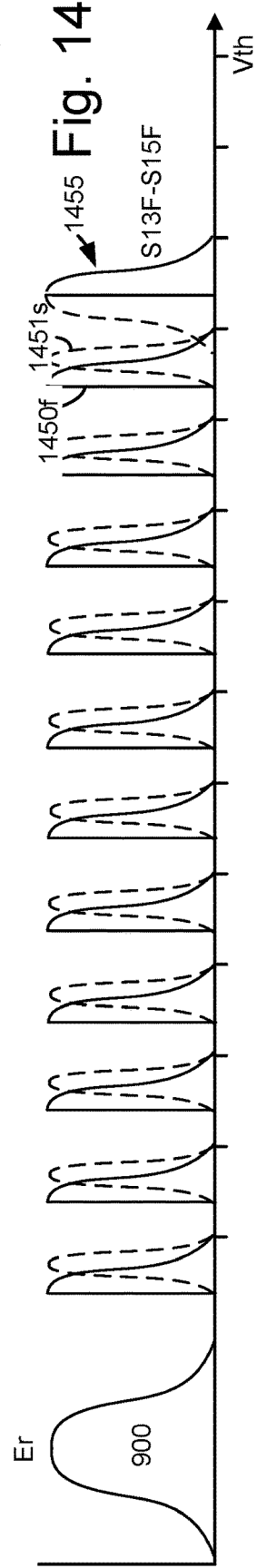

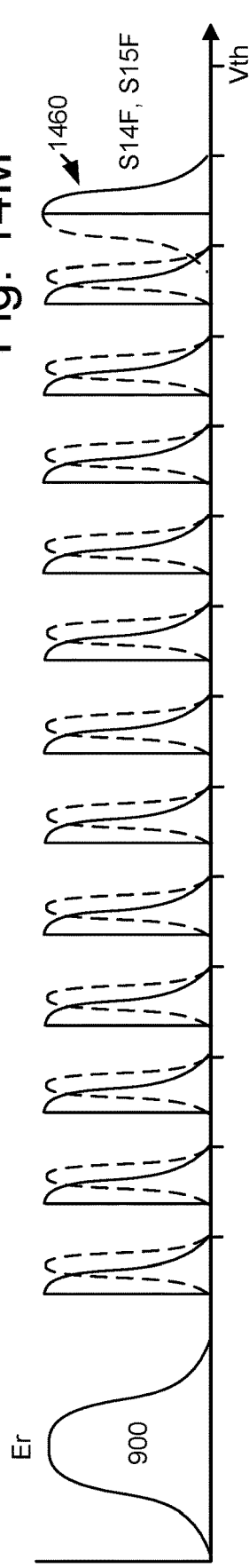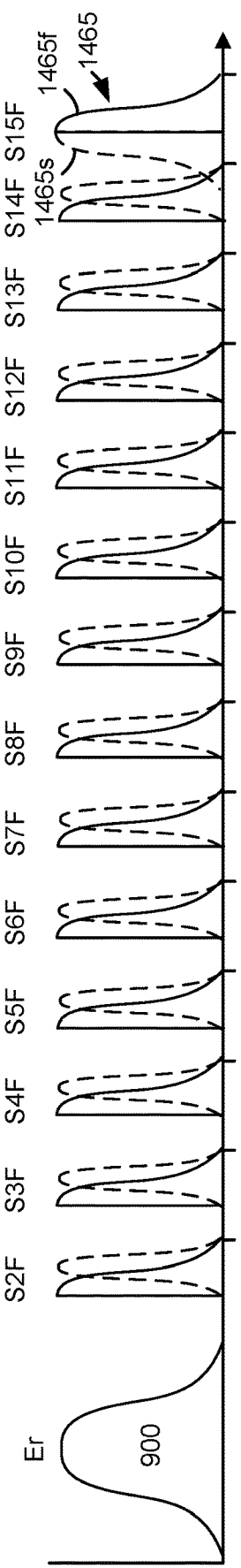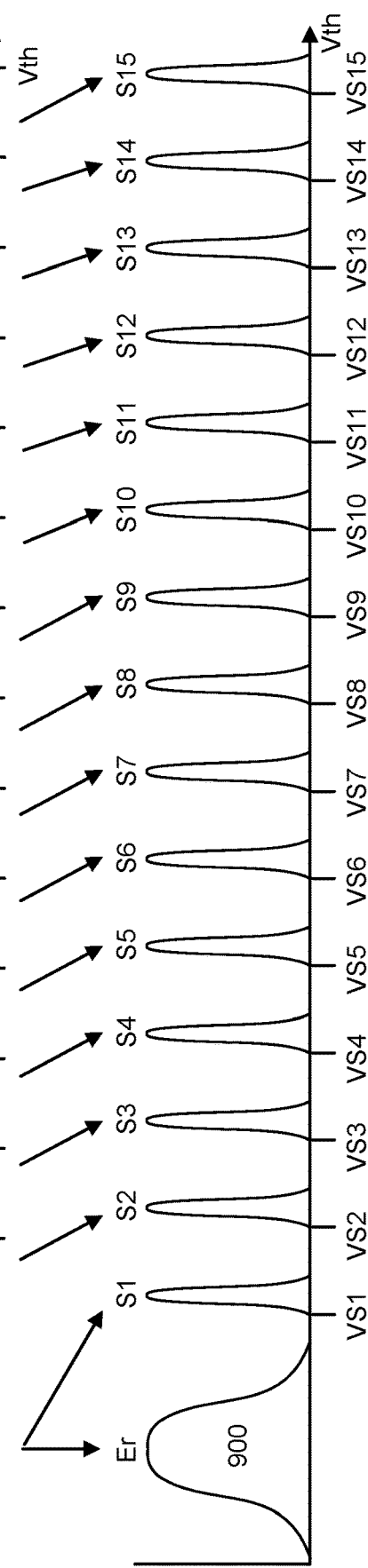

Fig. 15

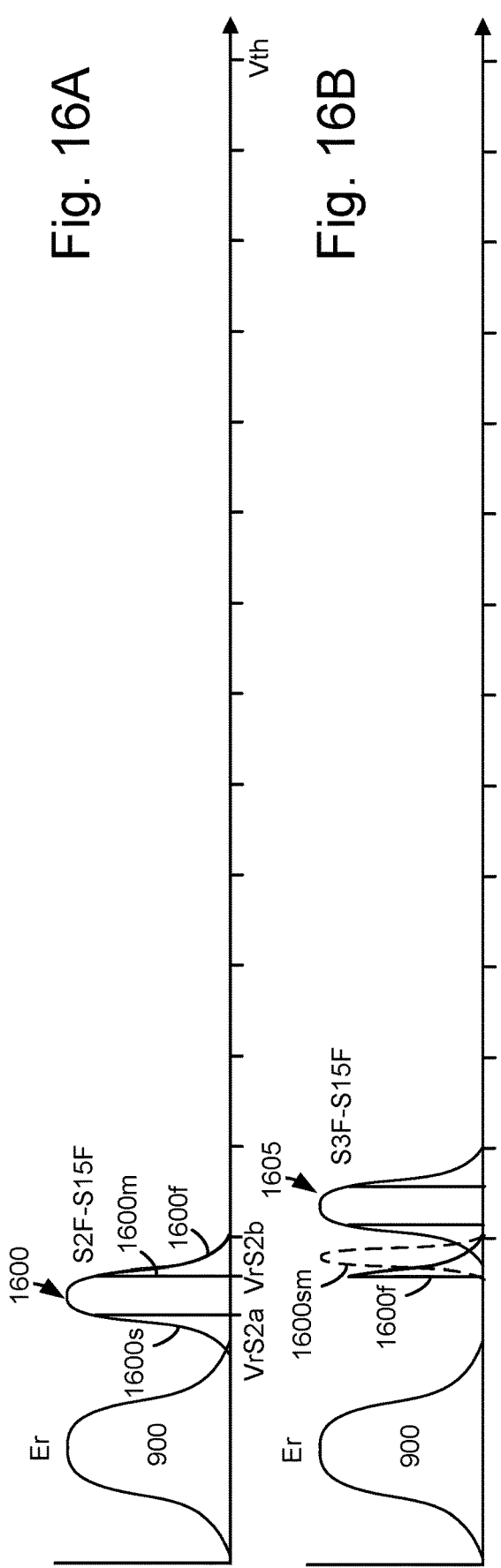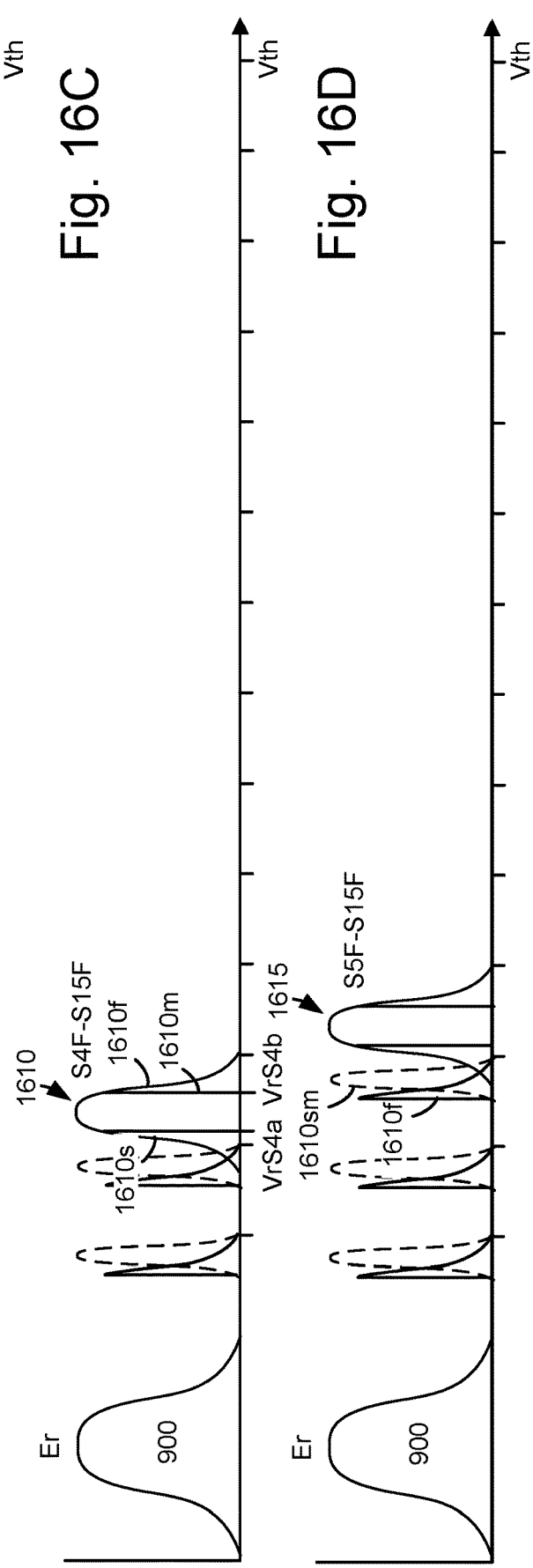

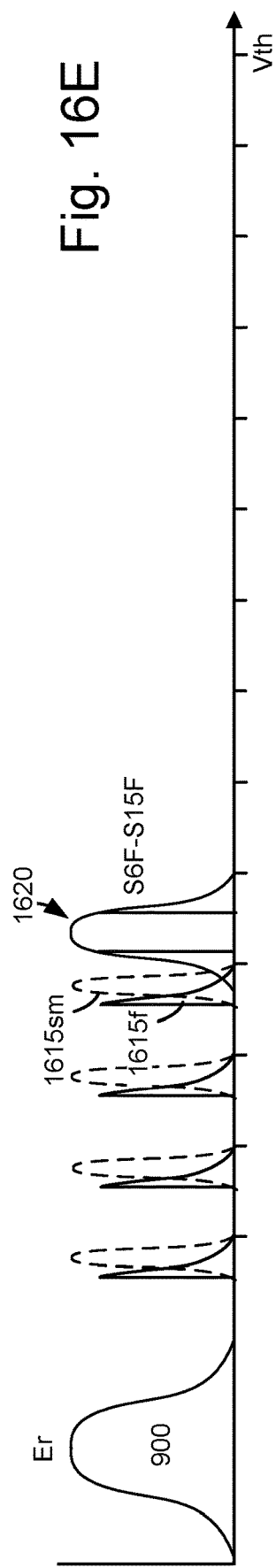

FOGGY-FINE PROGRAMMING FOR MEMORY CELLS WITH REDUCED NUMBER OF PROGRAM PULSES

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130a communicates with the memory structure 126 on a separate second die 126b.

FIG. 9A depicts an example Vth distribution of a set of memory cells after a first, foggy program pass, including an erased state and fourteen foggy states S2F-S15F.

FIG. 9B depicts an example Vth distribution of a set of memory cells after a second, fine program pass, following the first program pass of FIG. 9A, including an erased state and fifteen final states, S1-S15.

FIG. 11A depicts a plot of a selected word line voltage versus program loop number in a first, foggy pass of a program operation, consistent with FIGS. 10A and 10B, where memory cells are classified as being slow or fast in terms of program speed.

FIG. 11B depicts a plot of a selected word line voltage versus program loop number in a first, foggy pass of a program operation, consistent with FIGS. 10A and 10B, where memory cells are classified as being slow, medium or fast in terms of program speed.

FIG. 14A depicts an example Vth distribution after checkpoint program loop 1 (PL1), consistent with FIGS. 10A, 10B and 11A, where memory cells are classified as being slow or fast.

FIG. 14B depicts an example Vth distribution after PL2, following FIG. 14A.

FIG. 14C depicts an example Vth distribution after checkpoint PL3, following FIG. 14B.

FIG. 14D depicts an example Vth distribution after PL4, following FIG. 14C.

FIG. 14E depicts an example Vth distribution after PL5, following FIG. 14D.

FIG. 14F depicts an example Vth distribution after PL6, following FIG. 14E.

FIG. 14G depicts an example Vth distribution after checkpoint PL7, following FIG. 14F.

FIG. 14H depicts an example Vth distribution after PL8, following FIG. 14G.

FIG. 14I depicts an example Vth distribution after PL9, following FIG. 14H.

FIG. 14J depicts an example Vth distribution after PL10, following FIG. 14I.

FIG. 14K depicts an example Vth distribution after checkpoint PL11, following FIG. 14J.

FIG. 14L depicts an example Vth distribution after PL12, following FIG. 14K.

FIG. 14M depicts an example Vth distribution after PL13, following FIG. 14L.

FIG. 14N depicts an example Vth distribution after PL14, following FIG. 14M.

FIG. 14O depicts an example Vth distribution in a second, fine program pass following FIG. 14N.

FIG. 15 depicts an example table of bit line voltage versus program loop (PL) and foggy state, for states S0-S15 and PL=1-15, consistent with FIGS. 14A-14N and 14P.

FIG. 16A depicts an example Vth distribution after PL1, consistent with FIGS. 10A, 10B and 11B, where memory cells are classified as being slow, normal or fast in terms of program speed.

FIG. 16B depicts an example Vth distribution after PL2, following FIG. 16A.

FIG. 16C depicts an example Vth distribution after PL3, following FIG. 16B.

FIG. 16D depicts an example Vth distribution after PL4, following FIG. 16C.

FIG. 16E depicts an example Vth distribution after PL5, following FIG. 16D.

FIG. 17 depicts an example table of bit line voltage versus program loop (PL) and foggy state, for states S0, S1 and S2F-S5F and PL=1-5, consistent with FIG. 16A-16E.

DETAILED DESCRIPTION

Figure 2:
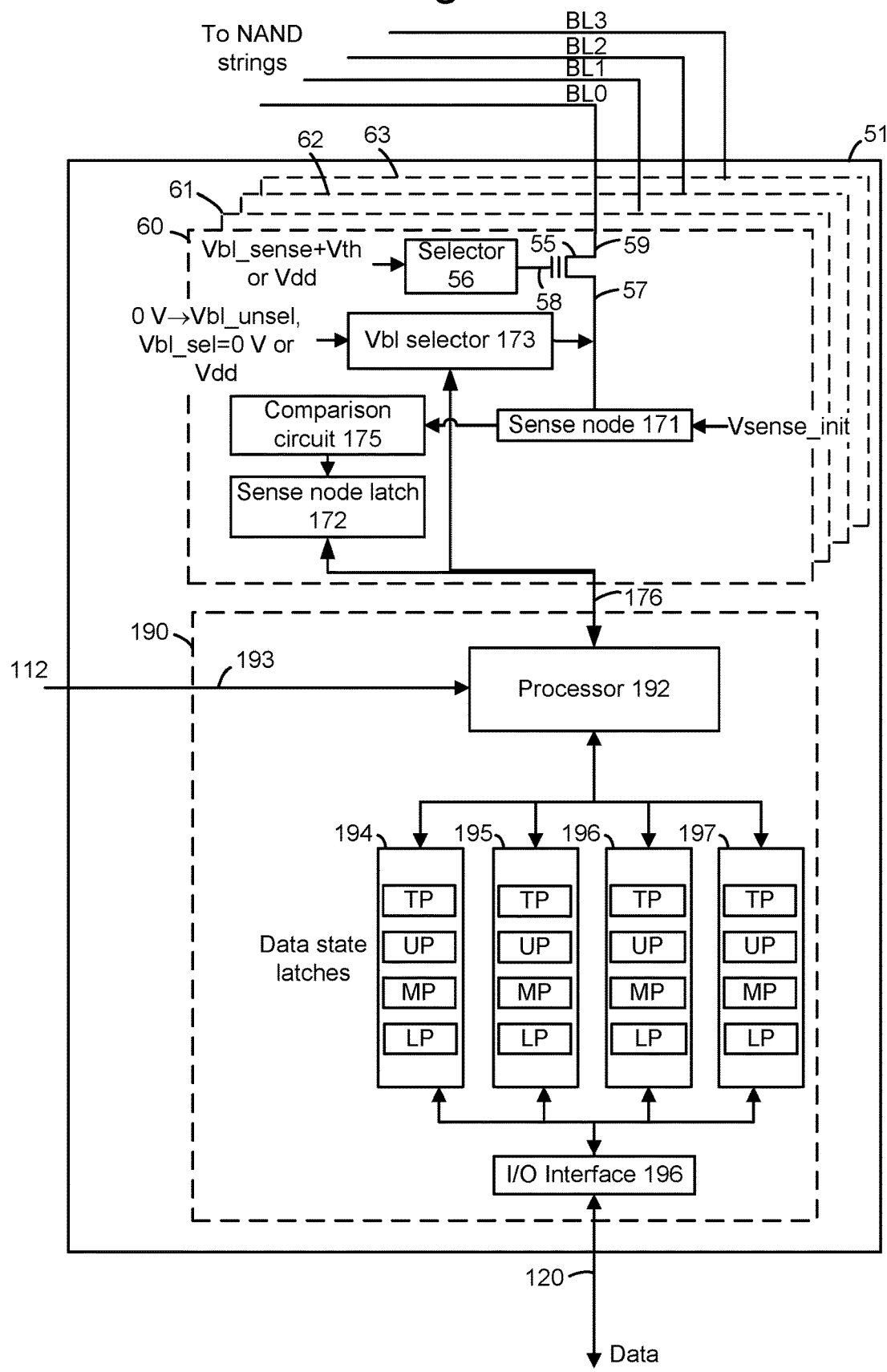
FIG. 2 is a block diagram depicting one embodiment of the sense block 51 of FIG. 1A.

Apparatuses and techniques are described for programming memory cells with a reduced number of program pulses.

In some memory devices, memory cells are connected to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. Memory cells can be connected in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extend vertically in the stack, such as a blocking oxide layer, a charge trapping layer, a tunneling layer and a channel layer.

In a 2D memory structure, the memory cells may be arranged in horizontal NAND strings on a substrate.

The memory cells can be programmed to have a threshold voltage (Vth) which corresponds to a data state. The Vth is a function of an amount of charge stored in a charge storing material of the memory cell. A program operation can include a sequence of program loops, where each program loop is performed by applying a program pulse to a selected word line. Each program loop can include one or more verify tests. However, it is difficult to accurately program the memory cells as the number of data states increases to meet the desire for increased storage density. One approach is to program the memory cells in multiple program passes. For example, a first program pass may be referred to as a foggy program pass in which the Vth of the memory cells is programmed close to the desired final level in so-called foggy states. A second program pass referred to as a fine program pass is then used in which the Vth of the memory cells is programmed more precisely to a final level, in final states. The number of program pulses used in the fine program pass is greater than in the foggy program pass so that greater precision is achieved.

However, there is a time penalty in performing multiple program passes.

Techniques provided herein address the above and other issues. In one approach, the number of program loops in the foggy program pass is minimized while still providing relatively narrow Vth distributions for the foggy states. The program loops include one or more checkpoint program loops in which a program speed of the memory cells is determined through a read operation. For example, the memory cells may be classified as being slow or fast programming when their Vth is below or above a read voltage, respectively. In a next program loop, the fast-programming memory cells are inhibited from programming while the slow-programming memory cells are programmed in a reduced program speed mode such as by applying a program speed-reducing bit line voltage, e.g., a positive bit line voltage. This process continues for each foggy state so that each foggy state Vth distribution is comprised of fast-programming memory cells which complete programming in an nth program loop and slow-programming memory cells which complete programming in an $n+1^{st}$ program loop.

In the foggy program pass, each program loop corresponds to a respective foggy state and, at a checkpoint program loop, the speed test is for memory cells configured to be programmed to a foggy state corresponding to the program loop. The speed test can also occur for memory cells configured to be programmed to one or more higher foggy states.

In one option, the program speed test is omitted for the highest foggy state.

In another option, the speed test classifies the memory cells into slow, medium and fast categories. Different program speed-reducing bit line voltages can be used for the slow and medium speed memory cells.

The program speed-reducing bit line voltages can be customized to each foggy state.

A program pulse step size can also be customized to each foggy state.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control circuit 115. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

The control circuitry 110 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. See an example column in FIG. 5. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit 130 on a first die 130*a* communicates with the memory structure 126 on a separate second die 126*b*. The control circuit may communicate with the memory structure and the die 126*b* via a memory interface 131, for example, similar to the memory interface 122*d*. Examples of a memory interface (I/F) include the Common Flash Memory Interface of JEDEC. The techniques described herein can be implemented with a control die 130*a* bonded to one or more memory die 126*b*, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130*a* and another portion of the read/write circuits are located on memory die 126*b*. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. The circuit can be configured to issue command via the memory interface to implement the techniques discussed herein.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG. 7, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the control gate of the transistor 55 to provide Vbl_sense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits.

During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a PCHSEL operation, or flipped from 0 to 1 in an FF fill operation.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of five data latches, e.g., comprising individual latches LP, MP, UP, and TP, can be provided for each sense circuit. In some cases, a different number of data latches may be used.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two agree, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain milestones in a program operations. For example, latches may identify that a memory cell's Vth is below a particular verify voltage. The data latches indicate whether a memory cell currently stores one or more bits from a page of data. For example, the LP, MP, UP or TP latches can be flipped (e.g., from 0 to 1) when a lower, middle, upper or top page bit, respectively, is stored in an associated memory cell. All 1's in the latches indicate that an associated memory cell has completed programming.

Figure 3:
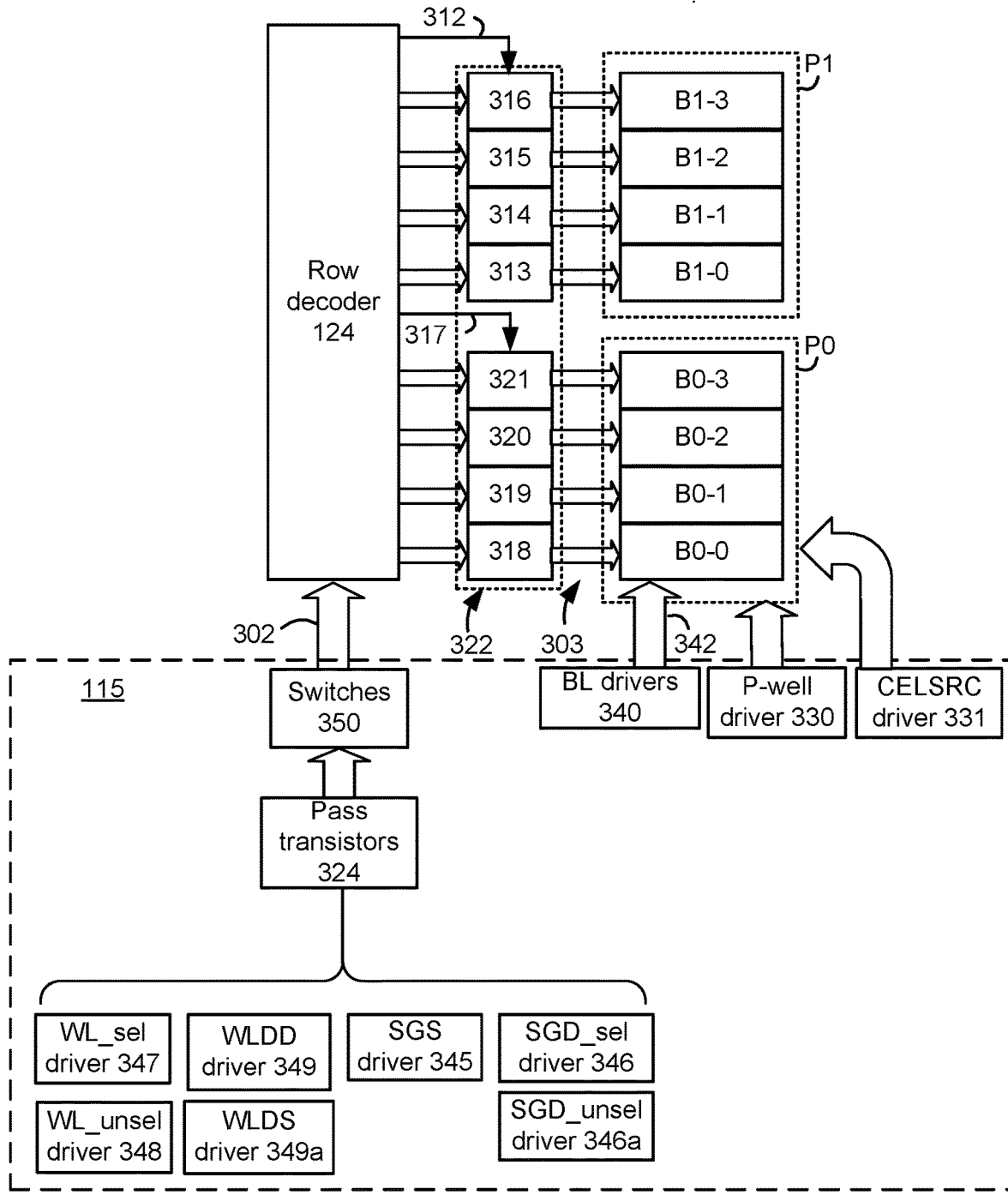
FIG. 3 depicts an example implementation of the power control circuit 115 of FIG. 1A for providing voltages to blocks of memory cells.
Figure 7:
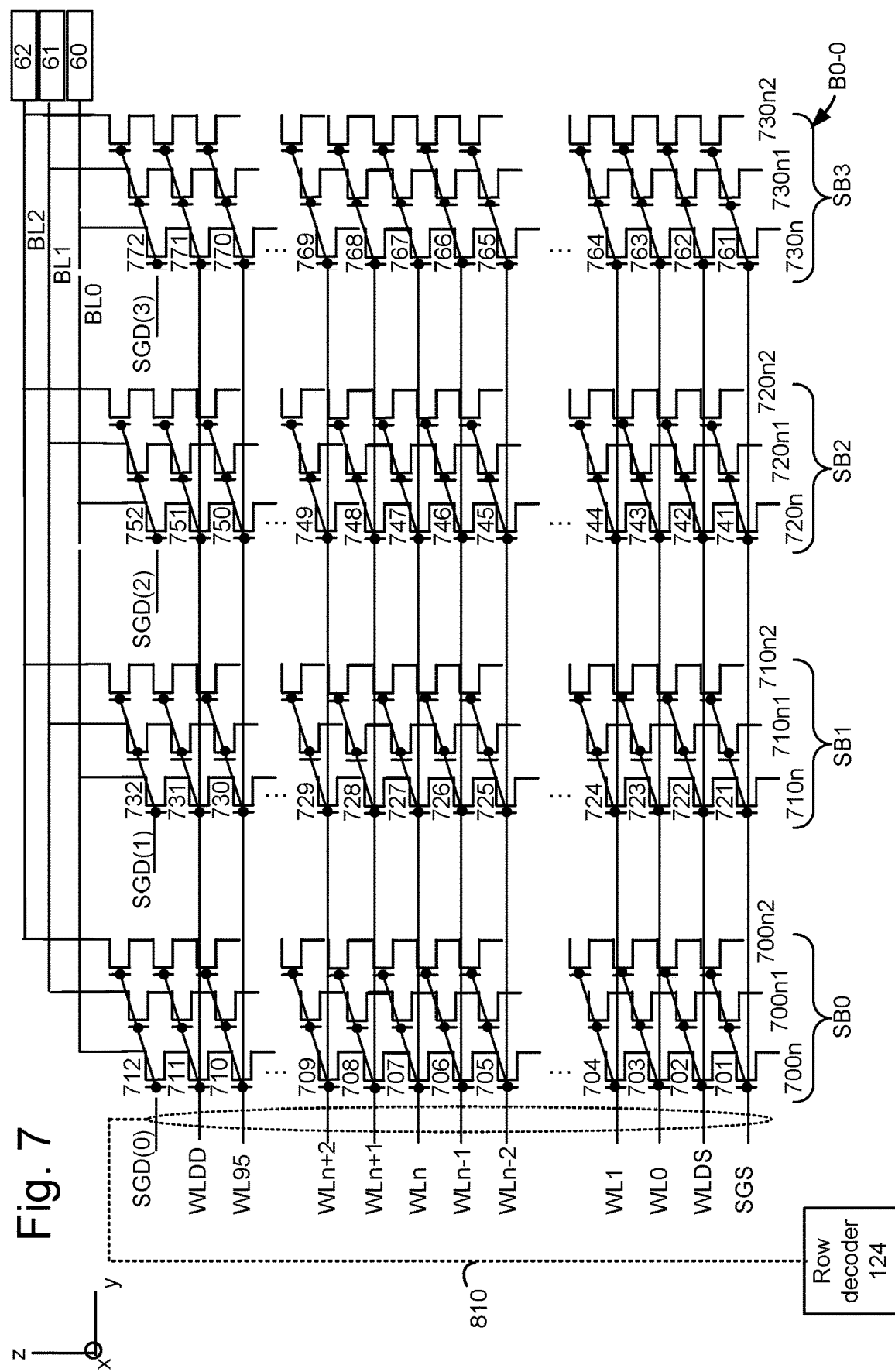
FIG. 7 depicts an example view of the block B0-0 of FIG. 4, with respective NAND strings arranged in sub-blocks, along with associated bit lines and sense circuits.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block, such as depicted in FIG. 7. The row decoder provides a control signal to pass transistors which connect the blocks to the row decoder. In one approach, the pass transistors of each set of blocks are controlled by a common control gate voltage. Thus, the pass transistors for a set of blocks are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a block enable line 312 is connected to sets of pass transistors 313-316, which in turn are connected to select gate and word lines of B1-0 to B1-3, respectively. A block enable line 317 is connected to sets of pass transistors 318-321, which in turn are connected to select gate and word lines of B0-0 to B0-3, respectively. The control signal on the block enable line 317 is therefore an enable signal for a set of blocks B0-0 to B0-3, and the control signal on the block enable line 312 is an enable signal for a set of blocks B1-0 to B1-3.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation. In one approach, the WL_unsel driver 348 provides a common voltage signal on each of unselected data word lines. In another approach, multiple drivers can be used to provide different voltage signals on different groups of unselected word lines.

In some cases, additional drivers are provided for the WLn−1 and WLn+1, the adjacent word lines of WLn.

Dummy word line drivers are also provided. The WLDD driver 349 provides a voltage signal on the drain-side dummy word line, WLDD, and the WLDS driver 349a provides a voltage signal on the source-side dummy word line, WLDS.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 524 in the p-well region 592, e.g., via the conductive path 524a. See FIG. 5. In one approach, the p-well region 592 is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 523 in the p-well region 592, e.g., via the local interconnect 523a in FIG. 5.

Bit line voltage drivers 340 include voltage sources which provide voltages to the bit lines 342. The bit line voltage for sensing can be 0.5 V, for example.

Figure 4:
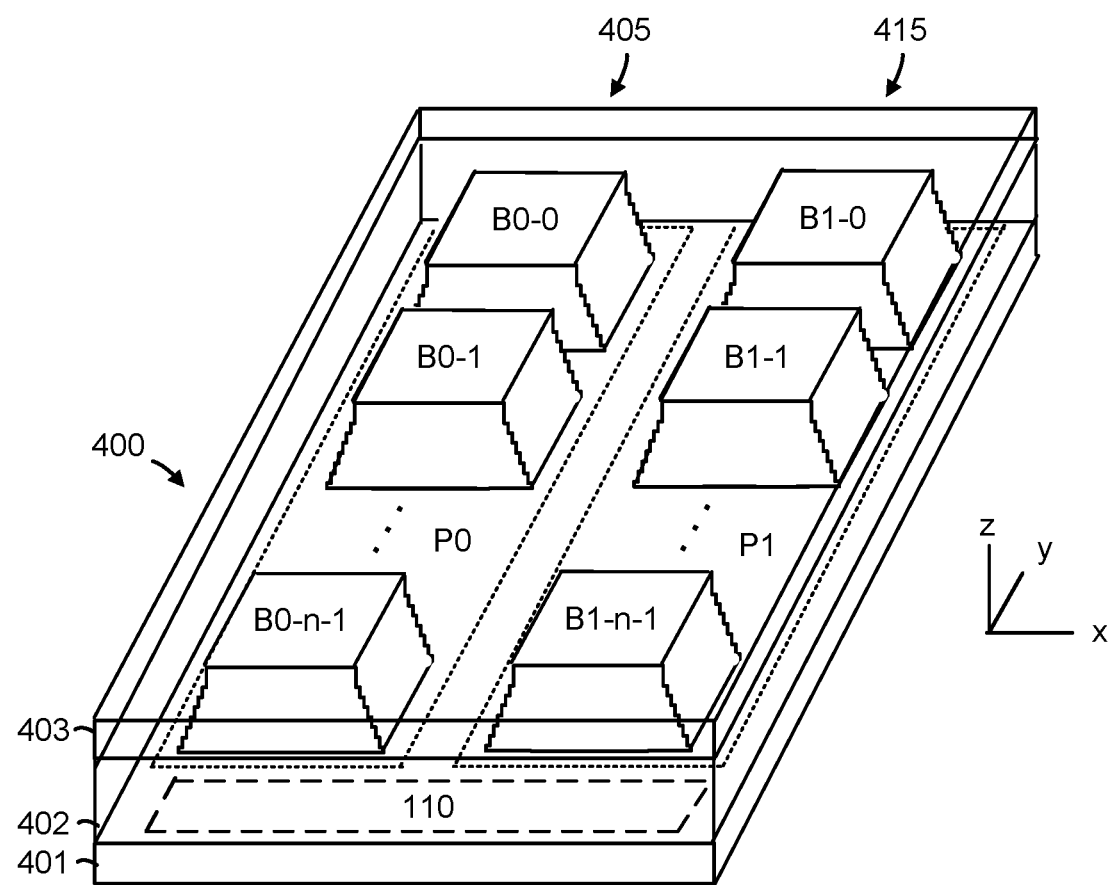
FIG. 4 is a perspective view of an example memory die 400 in which blocks are provided in respective planes P0 and P1, consistent with FIG. 3.

FIG. 4 is a perspective view of an example memory die 400 in which blocks are provided in respective planes P0 and P1, consistent with FIG. 3. The memory die includes a substrate 401, an intermediate region 402 in which blocks of memory cells are formed, and an upper region 403 in which one or more upper metal layers are patterned such as to form bit lines. Planes P0 and P1 represent respective isolation regions which are formed in the substrate 401. Further, a first block sequence 405 of a number n blocks, labelled B0-0 to B0-n−1, are formed in P0, and a second block sequence 415 of a number n blocks, labelled B1-0 to B1-n−1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in different planes can be erased concurrently.

The substrate 401 can also carry circuitry under the blocks, and one or more lower metal layers which are patterned in conductive paths to carry signals of the circuitry.

Figure 5:
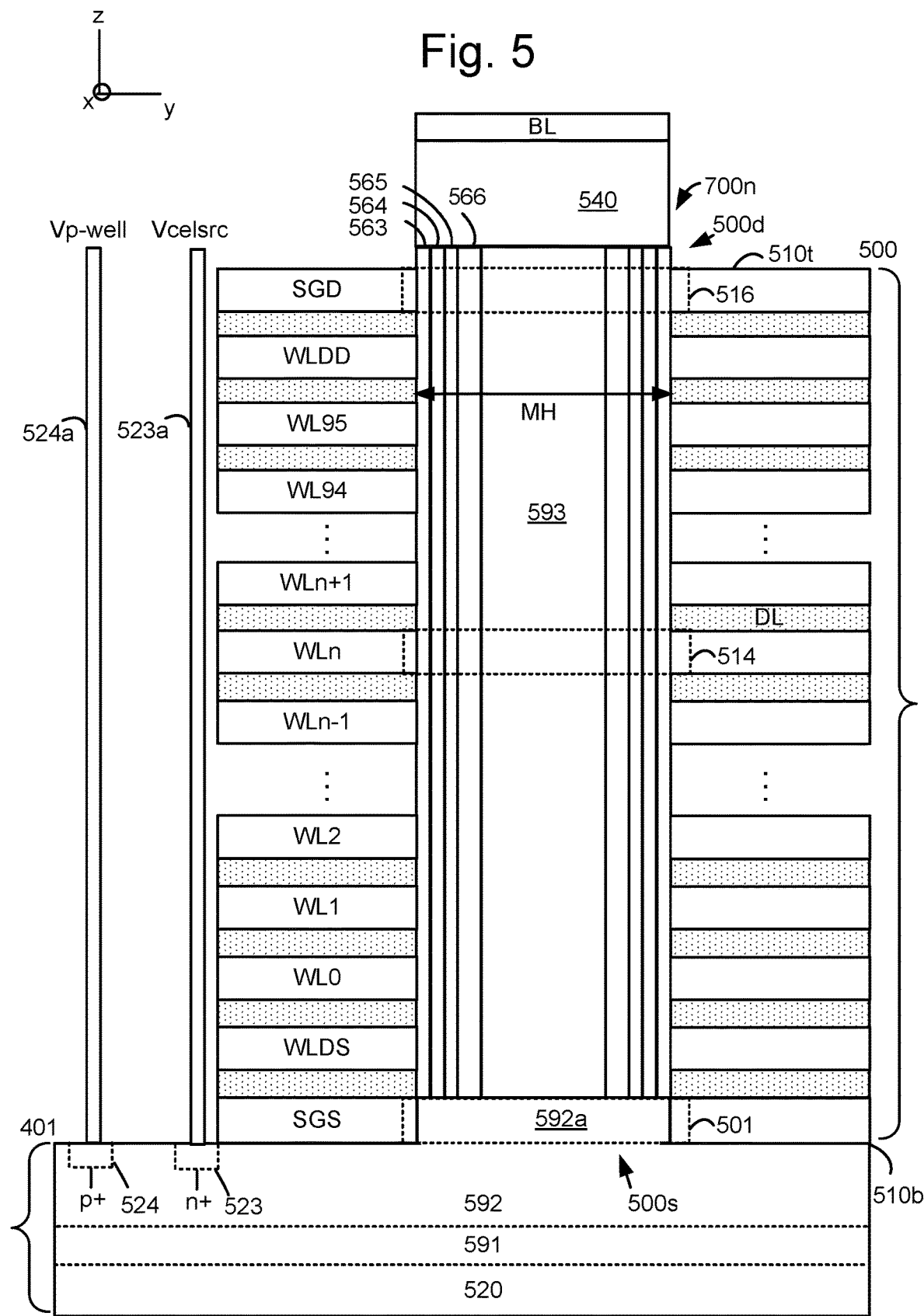
FIG. 5 depicts an example cross-sectional view of a portion of the block B0-0 of FIG. 4, including a NAND string 700n.

In this example, the memory cells are formed in vertical NAND strings in the blocks, consistent with FIG. 5. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

FIG. 5 depicts an example cross-sectional view of a portion of the block B0-0 of FIG. 4, including a NAND string 700n. The block comprises a stack 500 of alternating conductive layers (e.g., select gate layers and word line layers) and dielectric layers. The layers may be rectangular plates having a height in the z direction, a width in the y direction, and a length in the x direction. Example conductive layers include SGS, WLDS, WL0, WL1, WL2, ..., WLn−1, WLn, WLn+1, ..., WL94, WL95, WLDD and SGD. WLn denotes a selected word line for a read or program operation. The dielectric layers are shown by a dotted pattern and include an example dielectric layer DL. The conductive layers extend in a memory hole MH (see also FIG. 6).

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0), in addition to 96 data word lines in this example, although the number of data word lines could be greater or less than 96.

The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data.

A top 510t and bottom 510b of the stack are depicted. WL95 is the topmost data word line and WL0 is the bottommost data word line.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 516 is formed where the SGD control line intersects with the multiple thin layers, a source-side select gate transistor 501 is formed where the SGS control line intersects with the multiple thin layers, and a selected memory cell 514 is formed where WLn intersects with the multiple thin layers.

The multiple thin annular layers can be deposited, e.g., using atomic layer deposition. For example, the layers can include a blocking oxide layer 563, a charge-trapping layer 564 or film such as silicon nitride (Si3N4) or other nitride, a tunneling layer 565 (e.g., a gate oxide) and a channel layer 566 (e.g., comprising polysilicon). A dielectric core 593 (e.g., comprising silicon dioxide) can also be provided. In this example, all of the layers are provided in the memory hole. In other approaches, some of the layers can be provided in the word line or control line layer. The multiple thin layers form a columnar active area of a NAND string. A word line or control line can comprise a metal such as Tungsten.

The stack is formed on the substrate 401. In one approach, the substrate includes a p-well region 592 connected to the source ends of the NAND strings. The p-well region may comprise an epitaxial region 592a which extends upward adjacent to the SGS layer. The p-well region can include an n+ contact 523 connected to a local interconnect 523a (a conductive path or source line) for receiving Vcelsrc, and a p+ contact 524 connected to a conductive path 524a for receiving Vp-well. The local interconnect and conductive path can comprise a conductive material such as metal surrounded by an insulating material to prevent conduction with the metal of the adjacent word lines. The p-well region 592 can be formed in an n-well 591, which in turn is formed in a p-type semiconductor region 520 of the substrate, in one possible implementation.

The NAND string 700n has a source end 500s at a bottom 510b of the stack 500, connected to the p-well. The NAND string 500n also has a drain end 500d at a top 510t of the stack, connected to a bit line BL0 via a bit line contact 540 comprising an n-type material.

The NAND string in this 3D configuration is considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate, causing the electrons to return to the channel from the charge trapping layer.

Figure 6:
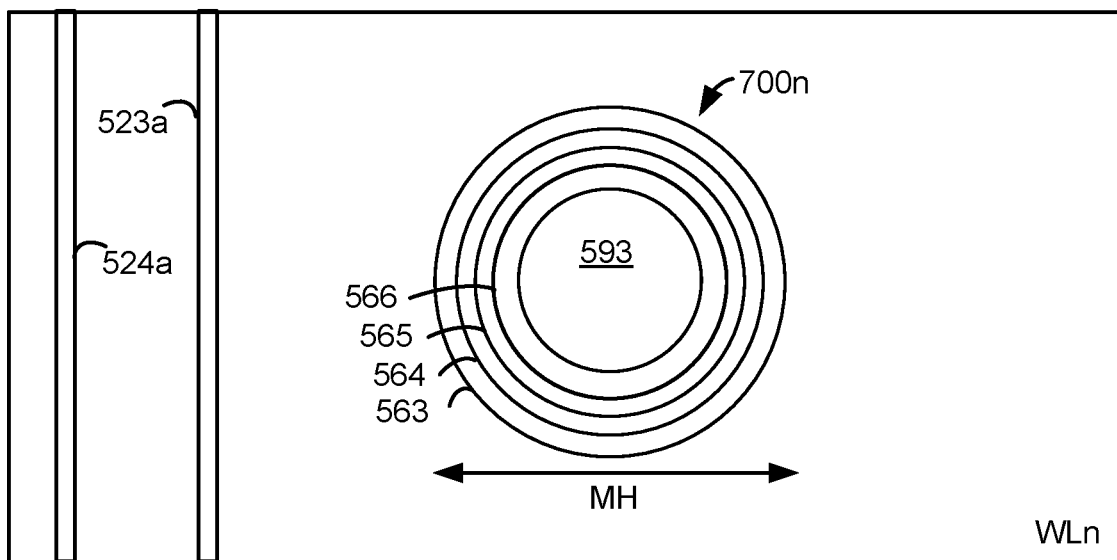
FIG. 6 depicts an example cross-sectional view of the block portion of FIG. 5 in the x-y plane at the level of WLn.

FIG. 6 depicts an example cross-sectional view of the block portion of FIG. 5 in the x-y plane at the level of WLn. The layers of the NAND string 700n are depicted, including the blocking oxide layer 563, charge-trapping layer 564, tunneling layer 565 and the channel layer 566. The dielectric core 593 is also depicted.

FIG. 7 depicts an example view of the block B0-0 of FIG. 4, with respective NAND strings arranged in sub-blocks, along with associated bit lines and sense circuits. The set of word lines WL0-WL95 are connected to memory cells arranged in NAND strings. The NAND strings are arranged in sub-blocks of the block in a 3D configuration. The block is consistent with FIGS. 5 to 7. Each sub-block SB0-SB3 includes multiple NAND strings. Three example NAND strings are depicted, as a simplification. For example, SB0 comprises NAND strings 700n, 700n1 and 700n2, SB1 comprises NAND strings 710n, 710n1 and 710n2, SB2 comprises NAND strings 720n, 720n1 and 720n2, and SB3 comprises NAND strings 730n, 730n1 and 730n2. The NAND strings have data word lines, dummy word lines and select gate lines. Each sub-block comprises a set of NAND strings which extend in the x direction and which have a common SGD line or control gate layer. In particular, SGD(0)-SGD(3) are in SB0-SB3, respectively.

Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. In one option, referred to as a regular programming order, the word line programming order may start at WL0, the source end word line and end at WL95, the drain end word line, for example. In another option, referred to as a reverse programming order, the programming starts from the highest word line, e.g., WL95, and ends at the lowest word line, e.g., WL0. This option can reduce neighbor word line interference.

Reading can occur for memory cells connected to a selected word line in a selected sub-block. Reading can occur one sub-block at a time.

In an erase operation, typically the entire block is erased, although a partial block erase is also possible.

Each NAND string comprises a plurality of memory cells between an SGS transistor and a SGD transistor, in this example. In other examples, more than one SGD and/or SGS transistor can be provided for each NAND string. The number of dummy memory cells can also vary. For example, the NAND string 700n includes an SGS transistor 701, a dummy memory cell 702, data memory cells 703-710, a dummy memory cell 711 and an SGD transistor 712. The NAND string 710n includes an SGS transistor 721, a dummy memory cell 722, data memory cells 723-730, a dummy memory cell 731 and an SGD transistor 732. The NAND string 720n includes an SGS transistor 741, a dummy memory cell 742, data memory cells 743-750, a dummy memory cell 751 and an SGD transistor 752. The NAND string 730n includes an SGS transistor 761, a dummy memory cell 762, data memory cells 763-770, a dummy memory cell 771 and an SGD transistor 772.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700n, 710n, 720n and 730n in SB0-SB3, respectively, BL1 is connected to NAND strings 700n1, 710n1, 720n1 and 730n1 in SB0-SB3, respectively, and BL2 is connected to NAND strings 700n2, 710n2, 720n2 and 730n2 in SB0-SB3, respectively. Each bit line is also connected to a respective sense circuit, consistent with the sense circuits of FIG. 2. For example, BL0-BL2 are connected to sense circuits 60-62, respectively.

The row decoder 124 is at one side of the block in this example, in a peripheral area of the substrate, consistent with the control circuitry 110 depicted in FIG. 4. The row decoder routes voltage signals to the word line via contacts 810. In one approach, the conductive paths extend vertically in the z direction to the upper region 403, then horizontally in the y direction and then vertically down in the −z direction in vias which contact the word lines. The side of the block may have a stair step shape in which the vias can contact an edge of each word line. In this example, it is assumed that the stair step shape is closest to SB0. As a result, the RC delay of a word line voltage signal will be smallest for SB0 and largest for SB3. The distance between the row decoder and the sub-blocks is considered to increase progressively for SB0-SB3.

Figure 8:
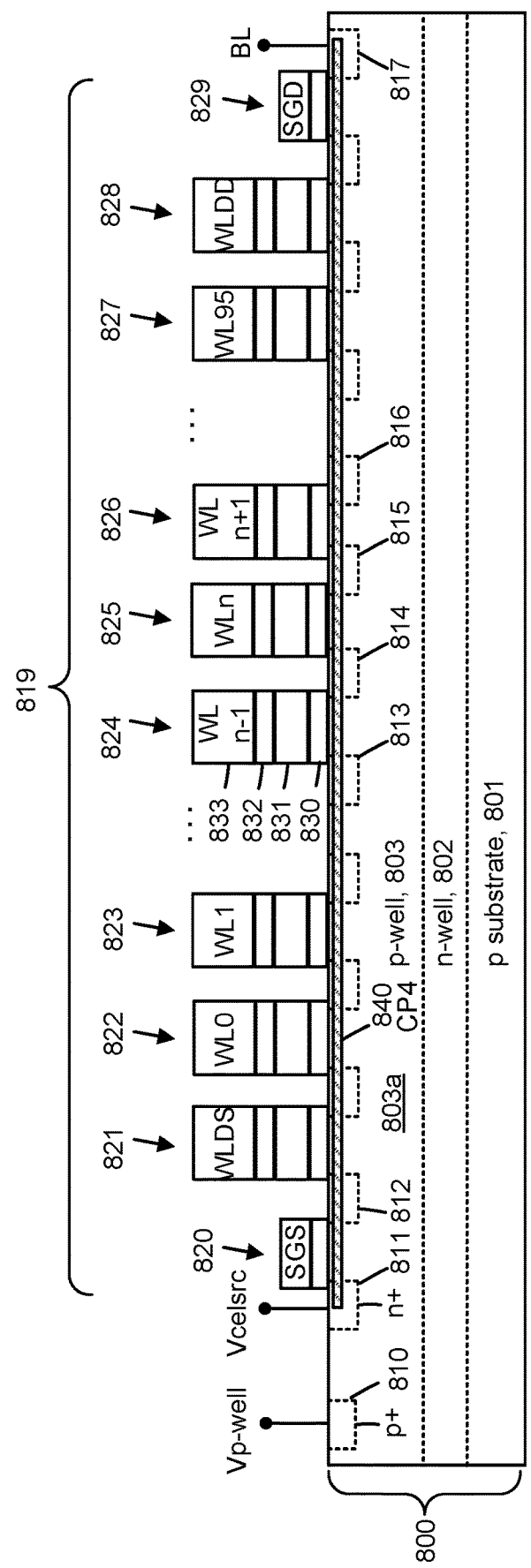
FIG. 8 depicts an example NAND string in a 2D configuration.

FIG. 8 depicts an example NAND string in a 2D configuration. The techniques discussed herein can be used in a 2D memory device as well as the above-described 3D memory device. The channel in a 2D memory device extends horizontally in the substrate rather than in a vertically extending channel layer. In this example, a substrate 800 includes a p-well 803 within an n-well 802, which in turn is in a p substrate 801. Vp-well and Vcelsrc are provided to the p-well via contacts 810 and 811, respectively. The contact 811 is a source line. The erase pulse can be Vp-well. A NAND string 819 is arranged on the substrate and include select gate transistors and memory cells. For example, the NAND string includes a SGS transistor 820, memory cells 821, 822 and 823 connected to WLDS, WL0 and WL1, respectively, memory cells 824, 825 and 826 connected to WLn−1, WLn and WLn+1, respectively, memory cells 827 and 828 connected to WL95 and WLDD, respectively, and a SGD transistor 829. Doped regions in the substrate, such as example doped regions 811-817, act as sources and drains of the transistors. Vbl is provided to the doped region 817. When appropriate voltages are provided to the NAND string, an inversion layer or channel 840 is formed in the p-well. A remaining portion 803a of the p-well is biased at Vp-well.

The example memory cell 824 comprises a tunnel oxide layer 830, a floating gate layer 831, a blocking oxide layer 832 and a control gate 833.

FIG. 9A depicts an example Vth distribution of a set of memory cells after a first, foggy program pass, including an erased state and fourteen foggy states S2F-S15F. Initially, the memory cells are provided in the erased (Er) state Vth distribution 900. In the foggy program pass, the memory cells are configured to be programmed to one of the foggy states based on data stored in respective data state latches, such as in FIG. 2. The data in the latches identifies a final state of the memory cell, where one or more final states are associated with each foggy state. In this example, there are four bits per cell and the final states are the Er state and programmed states S1-S15. Generally, two or more bits per cell can be used. In this example, the memory cells assigned to the S1 state are kept in the Er state in the foggy program pass, and the memory cells assigned to the S2-S15 states are programmed to foggy states S2F-S15F, respectively. The foggy states have a wider Vth distribution than the final states, depicted in FIG. 9B. The foggy states do not have verify voltages, in one approach. A verify voltage defines the desired lower tail of a Vth distribution of a state.

FIG. 9B depicts an example Vth distribution of a set of memory cells after a second, fine program pass, following the first program pass of FIG. 9A, including an erased state and fifteen final states, S1-S15. Each of the memory cells has an assigned data state in the second program pass based on a bit encoding such as in FIG. 13. For example, for each memory cell, the LP, MP, UP and TP bits together define one of the Er/S0-S15 states. If the Er state is assigned, the memory cell is not programmed in the foggy or fine pass. If the S1 state is assigned, the memory cell is programmed from the Er state to the S1 state in the fine pass. If the S2-S15 state is assigned, the memory cell is programmed to the assigned final state from the corresponding foggy state as depicted by the arrows.

The second, fine program pass involves applying successive program pulses, each of which is followed by one or more verify tests using final verify voltages VS1-VS15 for S1-S15, respectively. Optionally, a lower verify voltage VS1L-VS15L, not shown is also used for each of S1-S15, respectively, to invoke a reduced speed program mode.

Figure 10A:
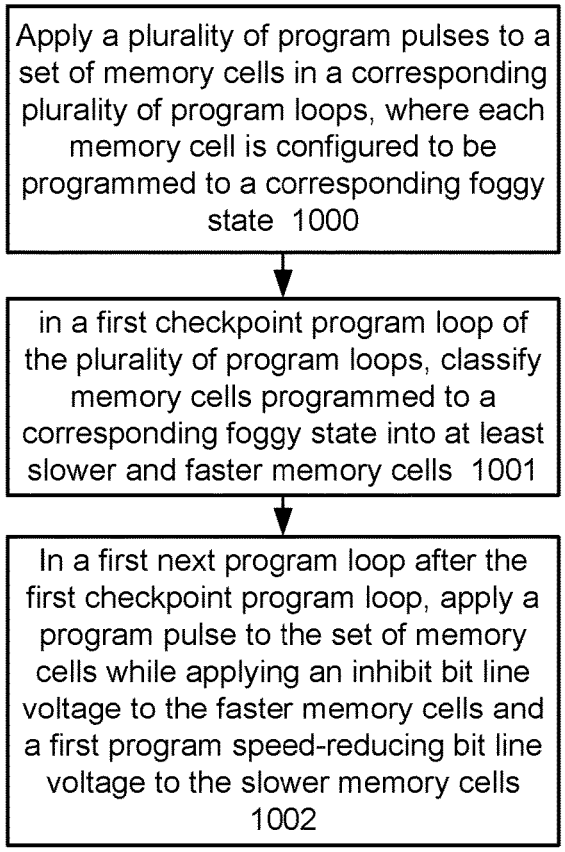
FIG. 10A depicts a flowchart of an example program operation which includes a first, foggy pass and a second, fine pass, where memory cells are classified and programmed based on their program speeds to narrow the Vth distributions.

FIG. 10A depicts a flowchart of an example program operation which includes a first, foggy pass and a second, fine pass, where memory cells are classified and programmed based on their program speeds to narrow the Vth distributions. Step 1000 includes applying a plurality of program pulses to a set of memory cells in a corresponding plurality of program loops, where the plurality of program pulses program the set of memory cells to a corresponding plurality of foggy states, and each memory cell is configured to be programmed to a corresponding foggy state. This configurating can involve storing and accessing data in respective latches. Step 1001 includes, in a first checkpoint program loop of the plurality of program loops, classifying memory cells programmed to a corresponding foggy state, e.g., S2F, into at least slower and faster memory cells. The program speed can also be determined for memory cells being programmed to higher foggy states than the corresponding foggy state of the first checkpoint program loop.

Generally, a foggy state SF(n) corresponds to a program loop PL(n−k) when k programmed states are not programmed in the foggy program pass. For example, if one programmed state, e.g., S1, is not programmed in the foggy program pass, as in the examples below, the corresponding program loops for S2F-S15F are PL1-PL14, respectively.

Step 1002 includes, in a first next program loop, e.g., an $n+1^{st}$ program loop, after the first checkpoint program loop, e.g., an nth program loop, applying a program pulse to the set of memory cells while applying an inhibit bit line voltage to the faster memory cells and a first program speed-reducing bit line voltage to the slower memory cells. The Vth of the slower memory cells is brought into alignment with the Vth of the faster memory cells by the program pulse of the first next program loop, resulting in a narrower overall Vth distribution.

Generally, one or more checkpoint program loops can be used, and memory cells associated with one or more foggy states can have their speed checked in each checkpoint program loop.

Figure 10B:
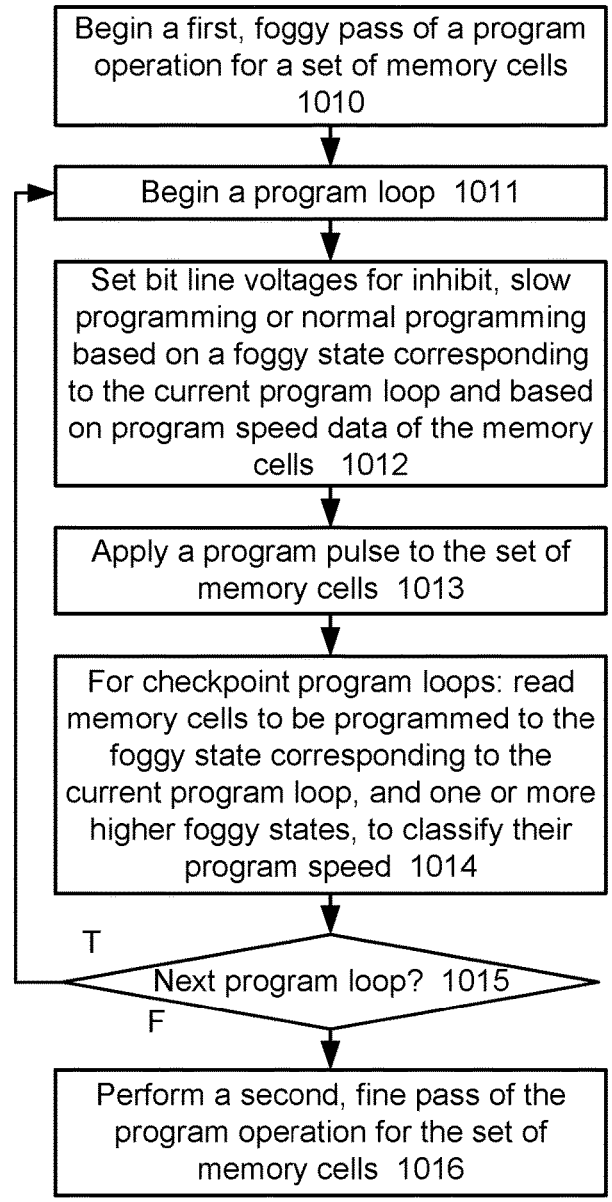
FIG. 10B depicts a flowchart of an example implementation of the program operation of FIG. 10A.

FIG. 10B depicts a flowchart of an example implementation of the program operation of FIG. 10A. Step 1010 begins a first, foggy pass of a program operation for a set of memory cells. Step 1011 begins a program loop. Step 1012 sets bit line voltages for inhibit, reduced speed programming or normal programming based on a foggy state corresponding to the current program loop and based on program speed data of the memory cells. For example, the bit line voltages can be set in an n+1st program loop and other successive program loops based on program speed information obtained in an nth program loop. An inhibit voltage can be set when the program speed information indicates a memory cell is fast programming, and a program speed-reducing bit line voltage can be set when the program speed information indicates a memory cell is slow programming. An inhibit bit line voltage is also set for memory cells which have previously been programmed to their corresponding foggy state.

Step 1013 includes applying a program pulse to the set of memory cells, with the bit line voltages set as in step 1012. Step 1014 includes, for checkpoint program loops, reading the memory cells to be programmed to the foggy state corresponding to the current program loop, and one or more higher foggy states, to classify their program speed. As mentioned, for example, the memory cells may be classified as being slow or fast programming when their Vth is below or above a read voltage, respectively. The program speed information can be stored in a latch for each memory cell. For example, one bit can identify a memory cell as being slow or fast programming. A slow programming memory cell is relatively slow-programming, while a fast-programming memory cell is relatively fast programming, i.e., faster than a slow programming memory cell.

A decision step 1015 determines whether there is a next program loop in the foggy pass. If the decision step is true (T), step 1011 is reached for a next foggy program loop. If the decision step 1015 is false, the foggy program pass is completed and step 1016 includes performing a second, fine program pass of the program operation for the set of memory cells.

FIG. 11A depicts a plot 1100 of a selected word line voltage versus program loop number in a first, foggy pass of a program operation, consistent with FIGS. 10A and 10B, where memory cells are classified as being slow or fast in terms of program speed. A respective program pulse PP1-PP15 is applied in each program loop, PL1-PL15, respectively. PP1 is represent by the pulse 1101. The program pulses may increase in consecutive program loops as depicted according to respective step sizes. The step size for a program pulse is the amount by which the program pulse is stepped up relative to the prior program pulse. The step size can be different for different program loops to optimize the foggy pass programming.

Some of the program loops are designated as checkpoint program loops in which the program speed is assessed. In this example, the checkpoint program loops are PL1, PL3, PL7 and PL11, associated with S2F, S4F, S8F and S12F, respectively. In each checkpoint program loop, the program pulse is followed by a read voltage. For example, PL1, PL3, PL7 and PL11 include associated read voltages 1102-1105, respectively. Each read voltage can have a different magnitude, and the read voltages become successively higher as the program pass proceeds. The read voltages are used to classify the program speeds of the memory cells, as discussed. As mentioned, each program pulse corresponds to a foggy state based on the number of programmed state which are not programmed in the foggy pass, and the read voltage which follows a program pulse is used to classify the program speed of the memory cells being programmed to that foggy state and to one or more higher foggy states.

For example, the read voltage 1102 (e.g., VrS2 in FIG. 14A) can be used to classify the program speed of memory cells being programmed to S2F-S15F, or just to S2F and S3F. If a program speed is also determined in PL1 for memory cells being programmed to S4F-S15F, it will be overwritten by the program speed determined in the next checkpoint program loop, PL3. The read voltage 1103 (e.g., VrS4 in FIG. 14C) can be used to classify the program speed of memory cells being programmed to S4F-S15F, or just to S4F-S7F. If a program speed is determined in PL3 for memory cells being programmed to S8F-S15F, it will be overwritten by the program speed determined in the next checkpoint program loop, PL7. The read voltage 1104 (e.g., VrS8 in FIG. 14G) can be used to classify the program speed of memory cells being programmed to S8F-S15F, or just to S8F-S11F. If a program speed is determined in PL7 for memory cells being programmed to S12F-S15F, it will be overwritten by the program speed determined in the next checkpoint program loop, PL11. The read voltage 1105 (e.g., VrS12 in FIG. 14K) can be used to classify the program speed of memory cells being programmed to S12F-S15F, or to just S12F-S14F if it is not desired to classify and program the S15 memory cells based on their program speed. It is acceptable in some cases for the highest programmed state, S15 in this example, to have a wider Vth distribution.

FIG. 11B depicts a plot of a selected word line voltage versus program loop number in a first, foggy pass of a program operation, consistent with FIGS. 10A and 10B, where memory cells are classified as being slow, medium or fast in terms of program speed. Generally, the memory cells can be classified into two or more groups based on their speed. This example involves three groups.

As above, a respective program pulse PP1-PP15 is applied in each program loop, PL1-PL15, respectively. PP1 is represent by the pulse 1111. Also as above, the checkpoint program loops are PL1, PL3, PL7 and PL11. In each checkpoint program loop, the program pulse is followed by a set of two read voltages. For example, PL1, PL3, PL7 and PL11 include sets of associated read voltages 1112-1115, respectively. The sets of read voltages become successively higher as the program pass proceeds. The sets of read voltages are used to classify the program speeds of the memory cells into slow, medium and fast groups. Each program pulse corresponds to a foggy state, and the set of read voltages which follows a program pulse are used to classify the program speed of the memory cells being programmed to that foggy state and to one or more higher foggy states.

For example, the set of read voltages 1112 (e.g., VrS2*a* and VrS2*b* in FIG. 16A) can be used to classify the program speed of memory cells being programmed to S2F-S15F, or just to S2F and S3F. The set of read voltages 1113 (e.g., VrS4*a* and VrS4*b* in FIG. 16C) can be used to classify the program speed of memory cells being programmed to S4F-S15F, or just to S4F-S7F. The set of read voltages 1114 can be used to classify the program speed of memory cells being programmed to S8F-S15F, or just to S8F-S11F. The set of read voltages 1115 can be used to classify the program speed of memory cells being programmed to S12F-S15F, or to just S12F-S14F.

Figures 12, 13:
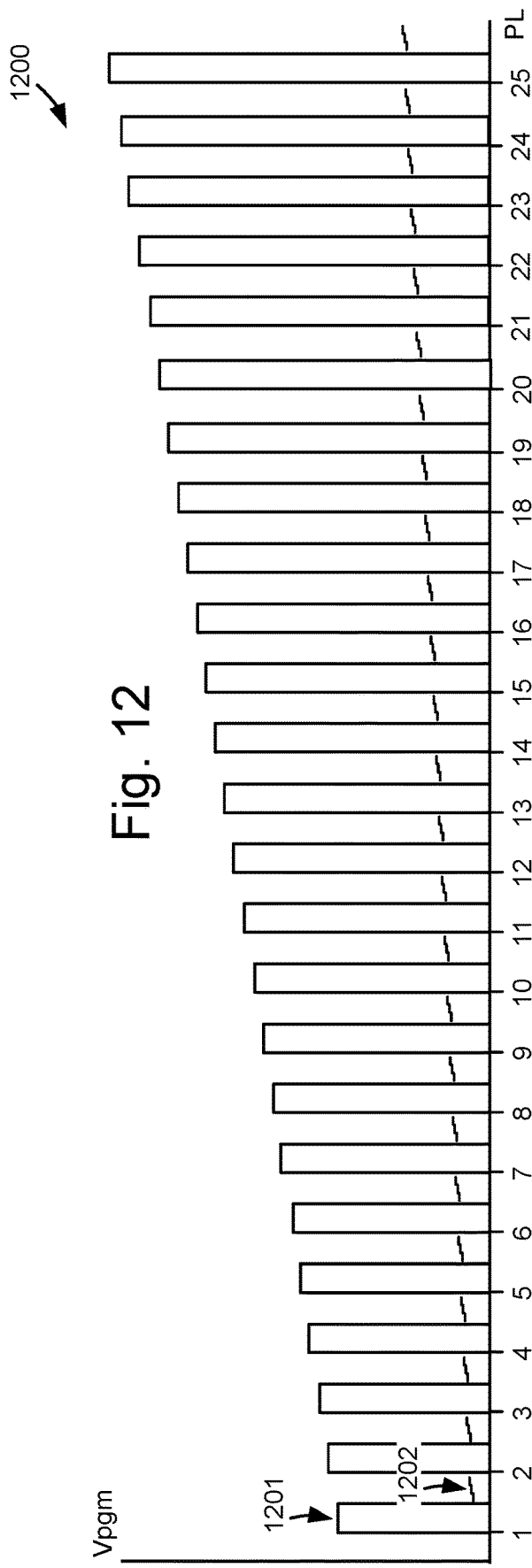
FIG. 12 depicts a plot 1200 of a selected word line voltage versus program loop number in a second pass of a program operation, consistent with FIGS. 11A and 11B.
FIG. 13 depicts an example bit encoding for the data states of FIGS. 9A and 9B.

FIG. 12 depicts a plot 1200 of a selected word line voltage versus program loop number in a second pass of a program operation, consistent with FIGS. 11A and 11B. In this example, the voltage signal includes 25 program-verify loops, PL1-PL25. Each loop includes a program pulse and verify voltages. For example, a program pulse plot 1201 and verify voltages (plot 1202) are provided in PL1. The verify voltages are depicted in a simplified form and can be provided for progressively higher data states as the programming proceeds. The peak magnitudes of the program pulses may increase in consecutive program loops according to a fixed step size (dVpgm), in a technique referred to as incremental step pulse programming. dVpgm is the voltage increase between every two adjacent program loops.

FIG. 13 depicts an example bit encoding for the data states of FIGS. 9A and 9B. The table lists the pages LP, MP, UP and TP and the final data states Er/S0-S15. A set of bits which is all 1's indicates the Er/S0 state. A memory cell which completes programming to one of the S1-S15 states has its bits set to all 1's to indicate that programming is completed.

Figure 14P:
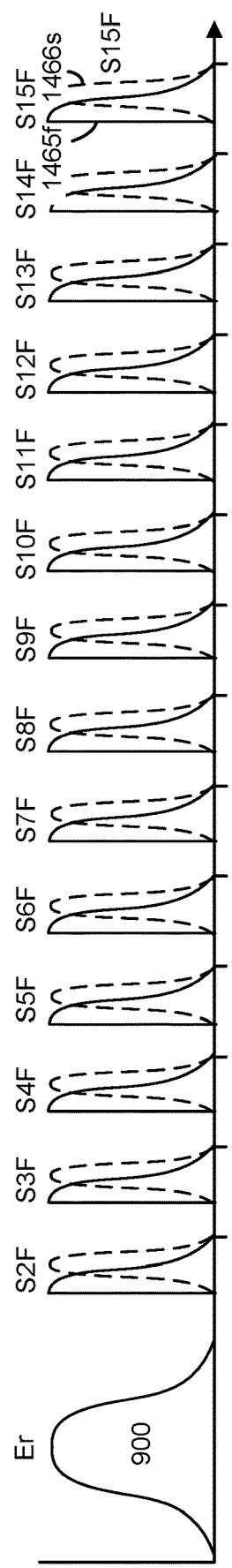
FIG. 14P depicts an example Vth distribution after PL15, following FIG. 14N.

FIG. 14A depicts an example Vth distribution after checkpoint PL1, consistent with FIGS. 10A, 10B and 11A, where memory cells are classified as being slow or fast. In FIGS. 14A-14P and 16A-16E, the vertical axis denotes a number of memory cells on a log scale and the horizontal axis denotes Vth on a linear scale. For reference, the horizontal axis includes hash marks which identify desired levels of the upper tails of the foggy states. For simplicity, the Vth distributions are normalized to a uniform magnitude unless described otherwise.

The memory cells assigned to the programmed states S1-S15 are configured to be programmed to a corresponding one of the foggy states. Additionally, each program loop corresponds to one of the foggy states. That is, programming of the fast memory cells for each foggy state is completed at a corresponding nth program loop. Programming of the slow memory cells for each foggy state is completed at a next, $n+1^{st}$ program loop. For example, programming of the fast memory cells for S2F-S15F may be completed at PL2-PL14, respectively. Optionally, programming for S15F is completed at PL15 instead of PL14.

PL1 results in the Vth distribution 1400 which represents memory cells configured to be programmed to the S2F-S15F foggy states. PL1 is a first checkpoint program loop in this example, so the memory cells are read using a read voltage VrS2 to identify slow and fast cells, and the speed information is stored in corresponding latches. The reading may divide the cells into two roughly equal groups as shown by the Vth distributions 1400s and 1400f for slow and fast cells, respectively. As mentioned, optionally, the reading is for fewer than all foggy states. The reading can be for the memory cells configured to be programmed to the foggy state (S2F), corresponding to the checkpoint program loop (PL1), and for memory cells configured to be programmed to one or more higher states (S3F and higher). One state is higher than another when its Vth is higher.

In one approach, a control circuit is configured to classify memory cells configured to be programmed to corresponding foggy states ranging from the corresponding foggy state (S2F) of the first checkpoint program loop (PL1) to one foggy state below (S3F) the corresponding foggy state of a second checkpoint program loop (PL3), into at least slower and faster memory cells, but not classify memory cells configured to be programmed to corresponding foggy states ranging from the corresponding foggy state of the second checkpoint program loop (S4F) to a highest foggy state (S15F) of the plurality of foggy states, into at least slower and faster memory cells.

FIG. 14B depicts an example Vth distribution after PL2, following FIG. 14A. After PL2, the Vth distribution 1400s of the slow S2F cells increases to provide the Vth distribution 1401s, which is aligned with the Vth distribution 1400f of the fast S2F cells, thus obtaining a narrower foggy Vth distribution for S2F. Also, the Vth of the S3F-S15F cells increases to provide the Vth distribution 1405, where the left and right halves of the Vth distribution, as defined by the vertical line, represent the slow and fast cells, respectively. A read operation is not performed in this program loop, in this example.

PL2 is an example of a first next program loop (e.g., an $n+1^{st}$ loop) after the first checkpoint program loop (e.g., an nth loop) of PL1. PL3 is an example of a second next program loop (e.g., an $n+2^{nd}$ loop) after the first next program loop.

FIG. 14C depicts an example Vth distribution after checkpoint PL3, following FIG. 14B. After PL3, the Vth distribution of the slow S3F cells increases to align with the Vth distribution of the fast S3F cells. Also, the Vth of the S4F-S15F cells increases to provide the Vth distribution 1410. PL3 is a second checkpoint program loop in this example, so the memory cells are read using a read voltage VrS4 to identify slow and fast cells, and the speed information is stored in corresponding latches, overwriting any prior speed information. The reading may divide the S4F-S15F cells into two roughly equal groups as shown by the Vth distributions 1410s and 1410f for slow and fast cells, respectively. Optionally, the reading is for fewer than all foggy states, e.g., S4F-S7F, since the program speed of the S8F and higher states is tested in a third checkpoint program loop.

FIG. 14D depicts an example Vth distribution after PL4, following FIG. 14C. After PL4, the Vth distribution 1410s of the slow S4F cells increases to provide the Vth distribution 1411s, which is aligned with the Vth distribution 1410f of the fast S4F cells, thus obtaining a narrower foggy Vth distribution for S4F. Also, the Vth of the S5F-S15F cells increases to provide the Vth distribution 1415, where the left and right halves of the Vth distribution represent the slow and fast cells, respectively. A read operation is not performed in this program loop, in this example.

FIG. 14E depicts an example Vth distribution after PL5, following FIG. 14D. After PL5, the Vth distribution of the slow S5F cells increases to provide a Vth distribution which is aligned with the Vth distribution of the fast S5F cells, thus obtaining a narrower foggy Vth distribution for S5F. Also, the Vth of the S6F-S15F cells increases to provide the Vth distribution 1420, where the left and right halves of the Vth distribution represent the slow and fast cells, respectively. A read operation is not performed in this program loop, in this example.

FIG. 14F depicts an example Vth distribution after PL6, following FIG. 14E. After PL6, the Vth distribution of the slow S6F cells increases to provide a Vth distribution which is aligned with the Vth distribution of the fast S6F cells, thus obtaining a narrower foggy Vth distribution for S6F. Also, the Vth of the S7F-S15F cells increases to provide the Vth distribution 1425, where the left and right halves of the Vth distribution represent the slow and fast cells, respectively. A read operation is not performed in this program loop, in this example.

FIG. 14G depicts an example Vth distribution after checkpoint PL7, following FIG. 14F. After PL7, the Vth distribution of the slow S7F cells increases to align with the Vth distribution of the fast S7F cells. Also, the Vth of the S8F-S15F cells increases to provide the Vth distribution 1430. PL7 is a third checkpoint program loop in this example, so the memory cells are read using a read voltage VrS8 to identify slow and fast cells, and the speed information is stored in corresponding latches, overwriting any prior speed information. The reading may divide the S8F-S15F cells into two roughly equal groups as shown by the Vth distributions 1430s and 1430f for slow and fast cells, respectively. Optionally, the reading is for fewer than all foggy states, e.g., S8F-S11F, since the program speed of the S12F and higher states is tested in a fourth checkpoint program loop.

FIG. 14H depicts an example Vth distribution after PL8, following FIG. 14G. After PL8, the Vth distribution 1430s of the slow S8F cells increases to provide the Vth distribution 1431s, which is aligned with the Vth distribution 1430f of the fast S8F cells, thus obtaining a narrower foggy Vth distribution for S8F. Also, the Vth of the S9F-S15F cells increases to provide the Vth distribution 1435, where the left and right halves of the Vth distribution represent the slow and fast cells, respectively. A read operation is not performed in this program loop, in this example.

FIG. 14I depicts an example Vth distribution after PL9, following FIG. 14H. After PL9, the Vth distribution of the slow S9F cells increases to provide a Vth distribution which is aligned with the Vth distribution of the fast S9F cells, thus obtaining a narrower foggy Vth distribution for S9F. Also, the Vth of the S10E-S15F cells increases to provide the Vth distribution 1440, where the left and right halves of the Vth distribution represent the slow and fast cells, respectively. A read operation is not performed in this program loop, in this example.

FIG. 14J depicts an example Vth distribution after PL10, following FIG. 14I. After PL10, the Vth distribution of the slow S10F cells increases to provide a Vth distribution which is aligned with the Vth distribution of the fast S10F cells, thus obtaining a narrower foggy Vth distribution for S10F. Also, the Vth of the S11F-S15F cells increases to provide the Vth distribution 1445, where the left and right halves of the Vth distribution represent the slow and fast cells, respectively. A read operation is not performed in this program loop, in this example.

FIG. 14K depicts an example Vth distribution after checkpoint PL11, following FIG. 14J. After PL11, the Vth distribution of the slow S11F cells increases to align with the Vth distribution of the fast S11F cells. Also, the Vth of the S12F-S15F cells increases to provide the Vth distribution 1450. PL11 is a third checkpoint program loop in this example, so the memory cells are read using a read voltage VrS12 to identify slow and fast cells, and the speed information is stored in corresponding latches, overwriting any prior speed information. The reading may divide the S12F-S15F cells into two roughly equal groups as shown by the Vth distributions 1450s and 1450f for slow and fast cells, respectively. Optionally, the reading is for fewer than all foggy states, e.g., S12F-S14F if the program speed of the S15F cells is not to be used.

FIG. 14L depicts an example Vth distribution after PL12, following FIG. 14K. After PL12, the Vth distribution 1450s of the slow S12F cells increases to provide the Vth distribution 1451s, which is aligned with the Vth distribution 1450f of the fast S12F cells, thus obtaining a narrower foggy Vth distribution for S12F. Also, the Vth of the S13F-S15F cells increases to provide the Vth distribution 1455, where the left and right halves of the Vth distribution represent the slow and fast cells, respectively. A read operation is not performed in this program loop, in this example.

FIG. 14M depicts an example Vth distribution after PL13, following FIG. 14L. After PL13, the Vth distribution of the slow S13F cells increases to provide a Vth distribution which is aligned with the Vth distribution of the fast S13F cells, thus obtaining a narrower foggy Vth distribution for S13F. Also, the Vth of the S14F and S15F cells increases to provide the Vth distribution 1460, where the left and right halves of the Vth distribution represent the slow and fast cells, respectively. A read operation is not performed in this program loop, in this example.

FIG. 14N depicts an example Vth distribution after PL14, following FIG. 14M. In this example, no further read operation and program speed assessment is made. The Vth distribution 1465 represents the S15F cells. The left and right halves of the Vth distribution, 1465s and 1465f, respectively, represent the slow and fast cells, respectively. A read operation is not performed in this program loop, in this example. The foggy program pass is completed at this point as represented by the Vth distributions of the S2F-S15F states.

FIG. 14O depicts an example Vth distribution in a second, fine program pass following FIG. 14N. The fine program pass can use a voltage signal such as depicted in FIG. 12 to program the memory cells to their final assigned states. The S1 cells are programmed from the Er state, and the S2-S15 cells are programmed from the S2F-S15F states, respectively. The fine program pass uses verify voltages VS1-VS15 for the S1-S15 states, respectively. The foggy program pass does not use verify voltages in this example.

FIG. 14P depicts an example Vth distribution after PL15, following FIG. 14N. This additional program loop is optional since, as mentioned, it can be acceptable for the highest foggy state to have a wider Vth than the other programmed states. In this case, a narrow Vth distribution is also achieved for S15F. After PL15, the Vth distribution 1465s of the slow S15F cells increases to provide the Vth distribution 1466s, which is aligned with the Vth distribution 1465f of the fast S15F cells, thus obtaining a narrower foggy Vth distribution for S15F. Programming in the fine pass can then occur.

In the example of FIG. 14A-14P, only 14 or 15 program pulses are used in the foggy program pass. Once program speed information is obtained, each program pulse serves to narrow the distribution of one foggy state while programming the cells to a next foggy state. Generally, when programming in PL(n), state S0 to S(n−1) cells and the fast cells of S(n) are inhibited with Vbl=inh. The memory cells of S(n+1) to S15 are programmed with a normal program speed using Vbl=0 V. The slow cells of S(n) are programmed with a program speed-reducing Vbl referred to as Vbl_S(n) to ensure that the Vth of these cells is superimposed with the Vth of the S(n) fast cells to achieve a narrow Vth distribution for S(n). Vbl_S(n) can be any of the voltages slw2 to slw15 in FIG. 15.

In this example, there are four checkpoint program loops in which the program speed is assessed, namely PL=1, 3, 7 and 11 which are associated with the foggy states S2F, S4F, S8F and S12F, where the corresponding read voltages verify levels are VrS2, VrS4, VrS8 and VS12. Moreover, the one or more checkpoint program loops are unequally spaced among the N=14 or 15 program loops. In another example, the one or more checkpoint program loops are equally spaced. For example, PL=1, 5, 9 and 13 for S2, S6, S10 and S14, respectively, are examples of equally spaced program loops. Another example uses PL1, 3, 5, 7, 9, 11 and 13 as checkpoint program loops.

The magnitude of the program voltage in PL1 can be optimized and adjusted based on prior program operations. For example, the results from programming one sub-block of a block can be used to set a program voltage for programming another sub-block. A control circuit can be configured to optimize a magnitude of an initial program pulse of the plurality of program pulses based on a prior program operation.

Additionally, instead of a fixed step size, the step size of the program voltage can be optimized for each the foggy states S3F-S14F in PL2-PL14, respectively.

The magnitude of the initial program voltage and the step size can also be optimized based on the position of the selected word line. For example, in a 3D NAND device, the width of the memory holes can vary based on the height of the word line in a stack. A greater height generally corresponds with a greater width, which may require a larger initial program voltage and/or step size to reach a given Vth level. In one approach, a set of memory cells is connected to a word line among a plurality of word lines arranged at different heights above a substrate, and the control circuit is configured to optimize a magnitude of an initial program pulse of the plurality of program pulses based on the height.

Ideally, the step size and Vbl for reduced speed programming are independently trimmed for each state. However, for efficiency, some states can share a common step size and/or Vbl for reduced speed programming to save parameter resources. Tests can be performed on a memory device to determine the optimum values.

In one approach, a step size for a program pulse in the first next program loop (PL2) after the first checkpoint program loop (PL1) is different than a step size for the next program loop (PL4) after the second checkpoint program loop (PL3).

Regarding the number of foggy states and the number and selection of checkpoint program loops, many variations are possible. One approach is to increase the number of checkpoint program loops to improve the precision of the slow/fast judgement. For QLC programming, e.g., with sixteen states, the number of checkpoint program loops can be between one and fourteen. We can just check the fast/slow cells in the first loop, or we can check the fast/slow cells in every loop. The number of checkpoint program loops depends on the trade-off between the accuracy and time cost of the fast/slow cells judgement.

Generally, one or more checkpoint program loops can be used.

Another approach, described further below, is to increase the number of read levels and program speed groups to obtain a narrower Vth distribution in the foggy program pass. For example, two read levels can be used for each checkpoint program loop to divide the cells into slow, medium or fast groups. See FIG. 16A-16E.

Also, as noted, the use of sixteen data states and four bits per cell is an example only as the number of bits per cell could be 2, 3, 4 or 5, for example.

An example method includes, in a first checkpoint program loop (PL1), classifying memory cells configured to be programmed to a next foggy state (S3) which is higher than the corresponding foggy state (S2) of the first checkpoint program loop into at least slower and faster memory cells. The method further includes, in a second next program loop (PL3) after a first next program loop (PL2), while applying a program pulse to the set of memory cells, applying an inhibit bit line voltage to the faster memory cells configured to be programmed to the next foggy (S3) state and a program speed-reducing bit line voltage to the slower memory cells configured to be programmed to the next foggy state (S3).

The method further includes, in the first next program loop (PL2) after the first checkpoint program loop (PL1), while applying the program pulse to the set of memory cells, applying a normal speed bit line voltage (0 V) to the memory cells configured to be programmed to the next foggy state (S3).

In another example a control circuit is configured to issue commands via a memory interface to: program a set of memory cells to N (e.g., 14) foggy states (e.g., S2F-S15F) using N program pulses; during the programming of the set of memory cells to the N foggy states, identify slower and faster programming memory cells for each foggy state of at least N−1 of the foggy states (e.g., S2-S14) and slowing programming of the faster programming memory cells; and program the set of memory cells from the N foggy states and an erased state to N+1 final states (e.g., S1-S15). The slowing of the programming of the faster programming memory cells can involve applying a program speed-reducing bit line voltage to these cells.

The N program pulses can be applied in N program loops, where the identifying of the slower and faster programming memory cells is performed in one or more checkpoint program loops of the N program loops.

The one or more checkpoint program loops may comprise no more than N/2 checkpoint program loops, in one approach.

Figure 15:
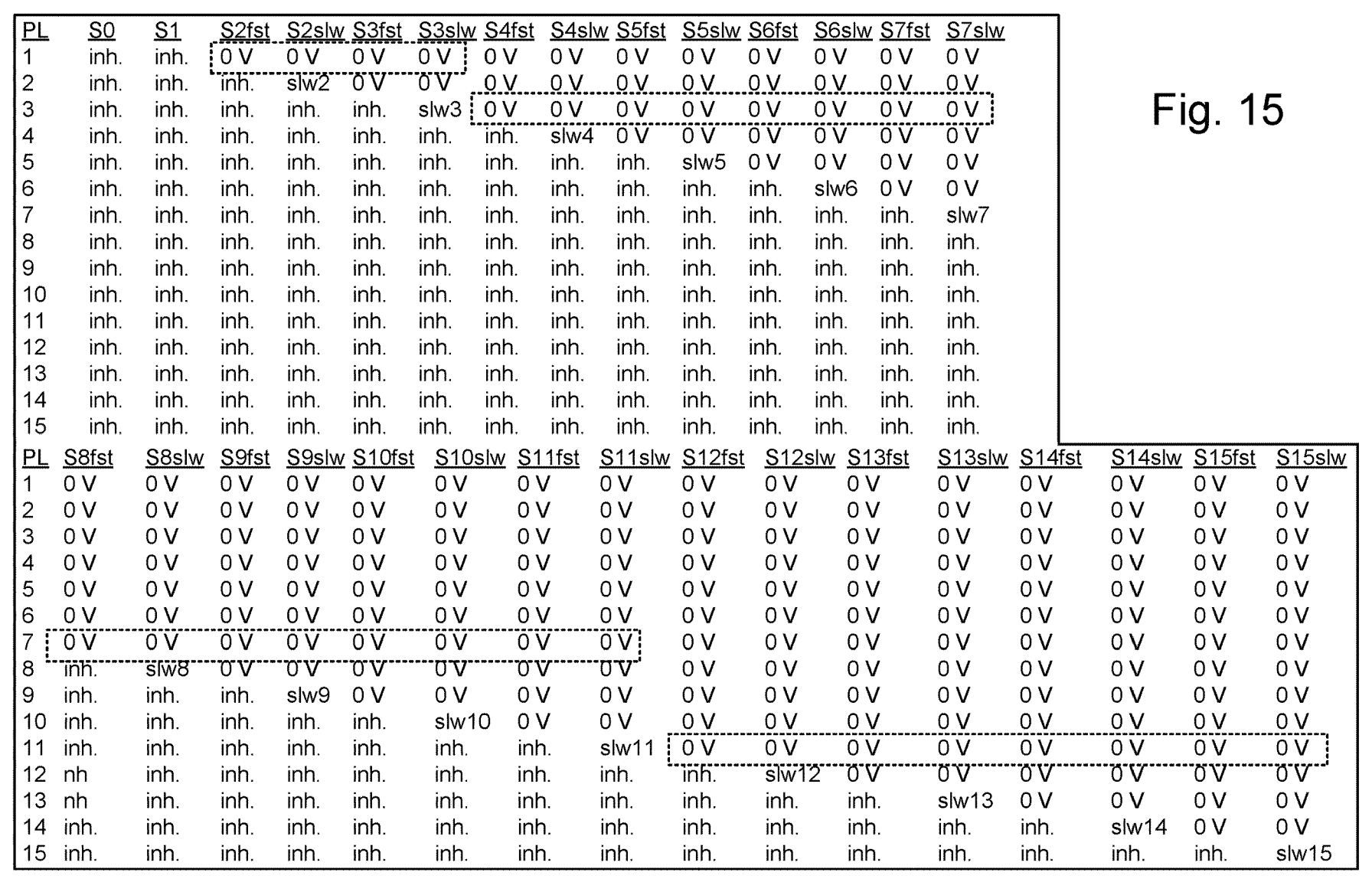

FIG. 15 depicts an example table of bit line voltage versus program loop (PL) and foggy state, for states S0-S15 and PL=1-15, consistent with FIGS. 14A-14N and 14P. As mentioned, the Vth distributions of the slow-programming memory cells can be increased to align with the Vth distributions of the fast-programming memory cells, for each foggy state. This results in a narrower Vth distribution for each foggy state. To achieve this, a specific program bias is applied to the memory cells in the form of a program voltage and bit line or drain voltage. The program voltage and bit line voltage can be optimized by testing for each foggy state. In theory, a separate bit line voltage can be defined for each foggy state, to optimally control the program speed of the slow programming cells. For efficiency, one or more common bit lines voltages can be shared by memory cells being programmed to different foggy states when controlling the program speed of the slow programming cells.

The bit line voltage can be a positive voltage which is a program speed-reducing bit line voltage, where Vbl=0 V, for example, provides a normal program speed. In FIG. 15, "slw" denotes a slow-programming cell, "fst" denotes a fast-programming cell, "inh" denotes an inhibit bit line voltage such as 1.5-2 V and slw2-slw15 denote speed-reducing bit line voltages. These voltages can all be different from one another. Or, some of these voltages can be the same. Slw2 is an example of a first program speed-reducing bit line voltage, and slw3 is an example of a second program speed-reducing bit line voltage.

In one approach, the program speed-reducing bit line voltage (slw2) in the first next program loop (PL2) after the first checkpoint program loop (PL1) is different than the program speed-reducing bit line voltage (slw3) in the next program loop (PL4) after the second checkpoint program loop (PL3). slw2 and slw3 may be the same or different, depending on what is optimal in the final product on silicon.

The dashed line boxes denote a program loop and foggy states for which a program speed is determined. Thus, the program speed of the S2F and S3F cells is determined in PL1, the program speed of the S4F-S7F cells is determined in PL3, the program speed of the S8-S11 cells is determined in PL7, and the program speed of the S12-S15 cells is determined in PL11. This option can reduce power consumption by avoiding read operations which will be later overwritten, at the expense of additional complexity. Another option is to also read all foggy states which are higher than S2, S4, S8 or S12 in PL1, PL3, PL7 or PL11, respectively. The program speed information for a cell can be overwritten when new information is obtained.

In PL1, the S0 and S1 cells are inhibited with Vbl=inh. and the S2-S15 cells are programmed with Vbl=0 V, e.g., with a normal program speed.

In PL2, the S0-S2fst cells are inhibited with Vbl=inh., the S2slw cells are programmed with Vbl=slw2, and the S3fst-S15 cells are programmed with Vbl=0 V.

In PL3, the S0-S3fst cells are inhibited with Vbl=inh., the S3slw cells are programmed with Vbl=slw3 and the S4fst-S15 cells are programmed with Vbl=0 V.

In PL4, the S0-S4fst cells are inhibited with Vbl=inh., the S4slw cells are programmed with Vbl=slw4 and the S5fst-S15 cells are programmed with Vbl=0 V.

In PL5, the S0-S5fst cells are inhibited with Vbl=inh., the S5slw cells are programmed with Vbl=slw5 and the S6fst-S15 cells are programmed with Vbl=0 V.

In PL6, the S0-S6fst cells are inhibited with Vbl=inh., the S6slw cells are programmed with Vbl=slw6 and the S7fst-S15 cells are programmed with Vbl=0 V.

In PL7, the S0-S7fst cells are inhibited with Vbl=inh., the S7slw cells are programmed with Vbl=slw7 and the S8fst-S15 cells are programmed with Vbl=0 V.

In PL8, the S0-S8fst cells are inhibited with Vbl=inh, the S8slw cells are programmed with Vbl=slw8 and the S9fst-S15 cells are programmed with Vbl=0 V.

In PL9, the S0-S9fst cells are inhibited with Vbl=inh., the S9slw cells are programmed with Vbl=slw9 and the S10fst-S15 cells are programmed with Vbl=0 V.

In PL10, the S0-S10fst cells are inhibited with Vbl=inh., the S10slw cells are programmed with Vbl=slw10 and the S11fst-S15 cells are programmed with Vbl=0 V.

In PL11, the S0-S11fst cells are inhibited with Vbl=inh., the S11slw cells are programmed with Vbl=slw11 and the S12fst-S15 cells are programmed with Vbl=0 V.

In PL12, the S0-S12fst cells are inhibited with Vbl=inh., the S12slw cells are programmed with Vbl=slw12 and the S13fst-S15 cells are programmed with Vbl=0 V.

In PL13, the S0-S13fst cells are inhibited with Vbl=inh., the S13slw cells are programmed with Vbl=slw13 and the S14fst-S15 cells are programmed with Vbl=0 V.

In PL14, the S0-S14fst cells are inhibited with Vbl=inh., the S14slw cells are programmed with Vbl=slw14 and the S15 cells are programmed with Vbl=0 V.

In the optional PL15, the S0-S15fst cells are inhibited with Vbl=inh., and the S15slw cells are programmed with Vbl=slw15.

The table can also specify a program voltage for each program loop.

FIG. 16A depicts an example Vth distribution after PL1, consistent with FIGS. 10A, 10B and 11B, where memory cells are classified as being slow, normal or fast in terms of program speed. FIG. 16A-16E provide example Vth distributions for PL1-PL5, respectively. The Vth distributions of the remaining program loops can proceed according to the same pattern shown here and in FIG. 14A-14P.

PL1 results in the Vth distribution 1600 for the memory cells corresponding to the S2F-S15F foggy states. PL1 is a first checkpoint program loop in this example, and the memory cells are read using lower and upper read voltages VrS2a and VrS2b, respectively, to identify slow, medium and fast cells, and the speed information is stored in corresponding latches. The slow cells have Vth<VrS2a, the medium cells have VrS2a≤Vth≤VrS2b and the fast cells have Vth>VrS2b.

The reading may divide the cells into three roughly equal groups as shown by the Vth distributions 1600s, 1600m and 1600f for slow, medium and fast cells, respectively. As mentioned, optionally, the reading is for fewer than all foggy states. The reading can be for the foggy state (S2F) corresponding to the checkpoint program loop (PL1) and one or more higher states (S3F and higher).

FIG. 16B depicts an example Vth distribution after PL2, following FIG. 16A. After PL2, the Vth distributions 1600s and 1600m of the slow and medium speed S2F cells increase to provide the Vth distribution 1600sm, which is aligned with the Vth distribution 1600f of the fast S2F cells, thus obtaining a narrower foggy Vth distribution for S2F. The Vbl will be lower for the medium speed cells than for the slow cells since the slow cells need a large Vth increase in the program loop to achieve the alignment. A lower Vbl results in a grater program bias, e.g., gate-to-drain voltage, for a given program voltage. Also, the Vth of the S3F-S15F cells increases to provide the Vth distribution 1605, where the three regions of the Vth distribution represent the slow, medium and fast cells, as shown by the vertical lines. A read operation is not performed in this program loop, in this example.

FIG. 16C depicts an example Vth distribution after PL3, following FIG. 16B. After PL3, the Vth distributions of the slow and medium S3F cells increase to align with the Vth distribution of the fast S3F cells. Also, the Vth of the S4F-S15F cells increases to provide the Vth distribution 1610. PL3 is a second checkpoint program loop in this example, so the memory cells are read using read voltages of VrS4a and VrS4b to identify slow, medium and fast cells, and the speed information is stored in corresponding latches, overwriting any prior speed information. The reading may divide the cells into three roughly equal groups as shown by the Vth distributions 1610s, 1610m and 1610f for slow, medium and fast cells, respectively. Optionally, the reading is for fewer than all foggy states, e.g., S4F-S7F, since the program speed of the S8F and higher states is tested in a third checkpoint program loop.

FIG. 16D depicts an example Vth distribution after PL4, following FIG. 16C. After PL4, the Vth distributions 1610s and 1610m of the slow and medium S4F cells increase to provide the Vth distribution 1610sm, which is aligned with the Vth distribution 1610f of the fast S4F cells, thus obtaining a narrower foggy Vth distribution. Also, the Vth of the S5F-S15F cells increases to provide the Vth distribution 1615, where the three regions of the Vth distribution represent the slow, medium and fast cells, as shown by the vertical lines. A read operation is not performed in this program loop, in this example.

FIG. 16E depicts an example Vth distribution after PL5, following FIG. 16D. After PL5, the Vth distributions of the slow and medium S5F cells increase to provide a Vth distribution which is aligned with the Vth distribution of the fast S5F cells, thus obtaining a narrower foggy Vth distribution for S5F. Also, the Vth of the S6F-S15F cells increases to provide the Vth distribution 1620, where the three regions of the Vth distribution represent the slow, medium and fast cells, respectively. A read operation is not performed in this program loop, in this example.

FIG. 17 depicts an example table of bit line voltage versus program loop (PL) and foggy state, for states S0, S1 and S2F-S5F and PL=1-5, consistent with FIG. 16A-16E. The table includes PL1-5. The bit line voltages for PL=6-15 follow the pattern which is set, similar to FIGS. 15A and 15B.

As mentioned, the Vth distributions of the slow and medium speed memory cells can be increased to align with the Vth distributions of the fast-programming memory cells, for each foggy state to provide a narrower Vth distribution.

To achieve this, a specific program bias is applied to the memory cells in the form of a program voltage and bit line or drain voltage.

Vbl can be a positive voltage, e.g., 0.1-0.7 V, which is a speed-reducing bit line voltage, where Vbl=0 V, for example, provides a normal program speed. In FIG. 15A, "slw" denotes a slow-programming cell, "med" denotes a medium programming cell, "fst" denotes a fast-programming cell, "inh" denotes an inhibit bit line voltage and slw2a, slw2b, slw3a, slw3b, slw4a, slw4b, slw5a and slw5b denote different speed-reducing bit line voltages. The dashed line boxes denote a program loop and foggy states for which a program speed is determined. Thus, as before, the program speed of the S2F and S3F cells is determined in PL1, and the program speed of the S4F-S7F cells is determined in PL3.

In PL1, the S0 and S1 cells are inhibited with Vbl=inh. and the S2-S5 cells are programmed with Vbl=0 V so that they are programmed with a normal program speed.

In PL2, the S0-S2fst cells are inhibited with Vbl=inh., the S2med and S2slw cells are programmed with Vbl=slw2a and slw2b, respectively, and the S3fst-S15 cells are programmed with Vbl=0 V.

In PL3, the S0-S3fst cells are inhibited with Vbl=inh., the S3med and S3slw cells are programmed with Vbl=slw3a and slw3b, respectively, and the S4fst-S15 cells are programmed with Vbl=0 V.

In PL4, the S0-S4fst cells are inhibited with Vbl=inh., the S4med and S4slw cells are programmed with Vbl=slw4a and slw4b, respectively, and the S5-S15 cells are programmed with Vbl=0 V.

In PL5, the S0-S5fst cells are inhibited with Vbl=inh., the S5med and S5slw cells are programmed with Vbl=slw5a and slw5b, respectively, and the S6-S15 cells are programmed with Vbl=0 V.

The table can also specify a program voltage for each program loop.

Figure 18:
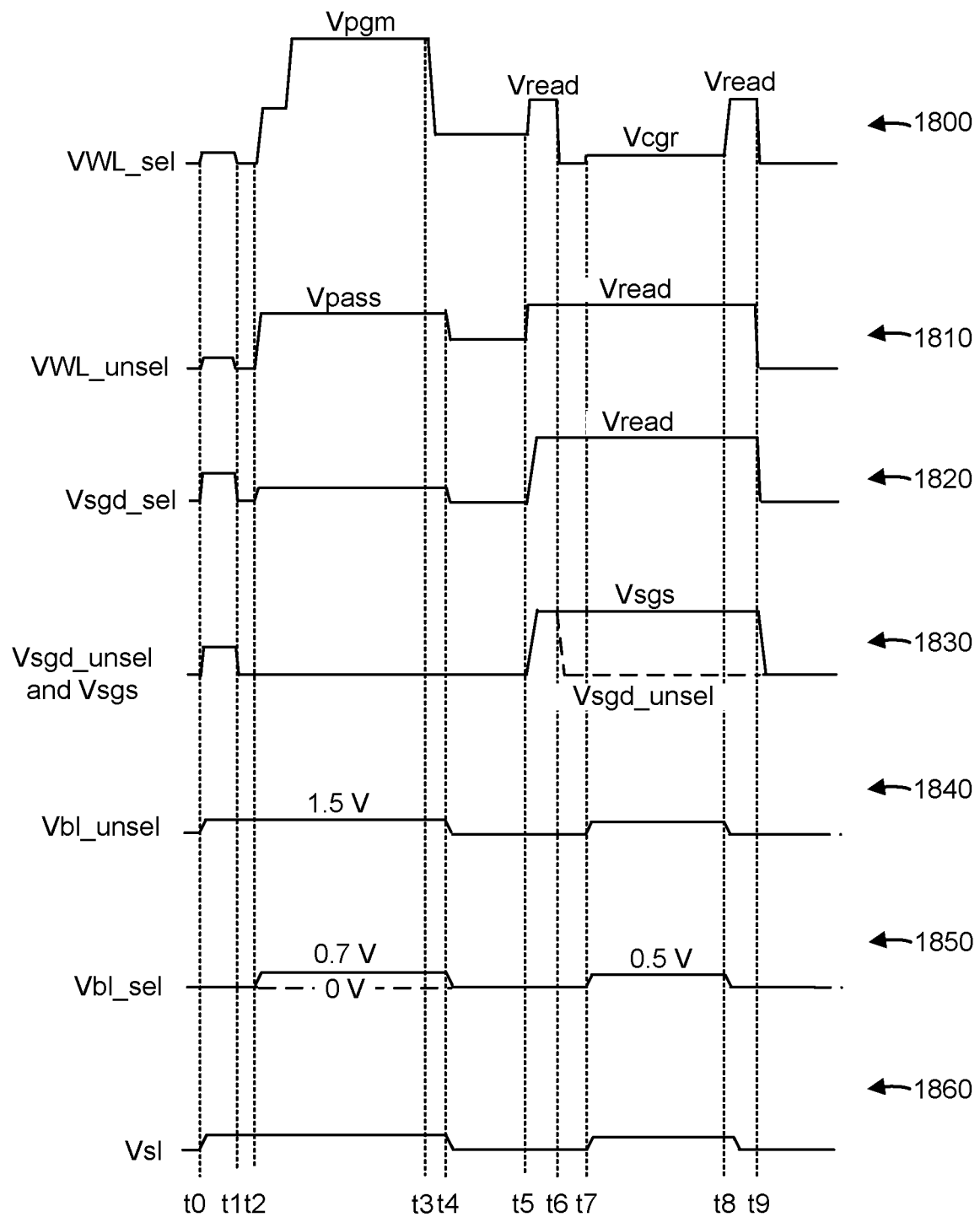
FIG. 18 depicts example plots for various voltage signals in a program loop consistent with FIGS. 11A, 11B, 12, 14A-14P and 16A-16E.

FIG. 18 depicts example plots for various voltage signals in a program loop consistent with FIGS. 11A, 11B, 12, 14A-14P and 16A-16E.

The program loop includes a pre-charge phase at t0-t1. A program pulse is applied at t2-t3. A recovery phase is at t3-t5. A Vread spike is applied before and after a sensing operation, at t5-t6 and t8-t9, respectively. This is a channel clean voltage which equalizes the channel potential. A sensing operation is performed at t7-t8. For example, in the foggy program pass, this can be a read operation which identifies slow and fast cells. In the fine program pass, this can be a verify test with one or more verify voltages.

A plot 1800 depicts VWL_sel, a voltage of a selected word line in the program operation. A plot 1810 depicts VWL_unsel, a voltage of unselected word lines. A plot 1820 depicts Vsgd_sel, the voltage for SGD transistors of a selected sub-block. A plot 1830 depicts Vsgd_unsel, the voltage for SGD transistors of an unselected sub-block, and Vsgs. A plot 1840 depicts Vbl_unsel, the voltage for bit lines connected to unselected NAND strings. A plot 1850 depicts Vbl_sel, the voltage for bit lines connected to selected NAND strings. A plot 1860 depicts Vsl, the source line voltage.

During the pre-charge, Vsgd_sel is elevated and Vbl_sel=0 V to provide the SGD transistor in a conductive state. Vsgd_sel is then returned to a lower level during the program pulse so that the SGD_sel transistor will be on or off if Vbl is low or high, respectively. With Vbl_unsel high, e.g., 1.5 V, the SGD transistors of the unselected NAND strings will be in a non-conductive state to inhibit programming.

For the selected NAND strings, Vbl_sel can be 0 V, an example of a normal speed bit line voltage, for normal speed programming, 0.7 V for slow speed programming or −1 V for an enhanced program bias, for example. Vbl can be in a negative range of −0.5 to −3 V, for example. A negative voltage can be provided on the memory chip using a triple well technology. The negative bit line voltage can be supplied by the column decoder. These bit line voltages are low enough to provide the corresponding SGD transistors in a conductive state.

During the pre-charge, for normal order programming (program from lower WL to upper WL), SGD_unsel is conductive and SGS is non-conductive. For reverse order program (program from upper WL to lower WL), SGD_unsel is non-conductive and SGS is conductive.

During the sensing, VWL_sel=Vcgr, a read or verify voltage. Vsgd_sel and Vsgs are set to Vread to provide the corresponding transistors in a conductive state to allow sensing to occur. Vsgd_unsel is spiked up to Vread at t5-t6 and then kept at 0 V while Vbl_unsel is set at a small positive voltage to provide the corresponding SGD transistors in a non-conductive state, to avoid interfering with the sensing of the selected NAND strings. The spiking of Vsgd_unsel to Vread helps drain out residue electrons from the channels of the unselected NAND strings in the unselected sub-blocks.

Vbl_sel is elevated to Vsense to allow sensing to occur.

Vsl can be elevated during the pre-charge, the program pulse and the verify test.

Accordingly, it can be seen that in one implementation, an apparatus comprises: a control circuit configured to connect to a set of memory cells, to perform a program operation for the set of memory cells. The control circuit is configured to: apply a plurality of program pulses to the set of memory cells in a corresponding plurality of program loops, each memory cell of the set of memory cells is configured to be programmed to a corresponding foggy state of a plurality of foggy states; in a first checkpoint program loop of the plurality of program loops, classify memory cells programmed to a corresponding foggy state into at least slower and faster memory cells; and in a first next program loop after the first checkpoint program loop, apply a program pulse to the set of memory cells while applying an inhibit bit line voltage to the faster memory cells and a first program speed-reducing bit line voltage to the slower memory cells.

In another implementation, a method comprises: in a first pass of a program operation, performing a plurality of program loops for a set of memory cells, the plurality of program loops are configured to program the set of memory cells to a corresponding plurality of foggy states, and each memory cell of the set of memory cells is configured to be programmed to a corresponding foggy state of the plurality of foggy states; in a first checkpoint program loop of the plurality of program loops, classify memory cells programmed to a corresponding foggy state into at least slower and faster memory cells; in a first next program loop after the first checkpoint program loop, while applying a program pulse to the set of memory cells, applying an inhibit bit line voltage to the faster memory cells and a program speed-reducing bit line voltage to the slower memory cells; and perform a second pass of the program operation, the performing the second pass comprising programming each memory cell of the set of memory cells from the corresponding foggy state to a corresponding final state.

In another implementation, an apparatus comprises: a control circuit configured to connect to a set of memory cells; and a memory interface connected to the control circuit. The control circuit is configured to issue commands via the memory interface to: program the set of memory cells to N foggy states using N program pulses; during the programming of the set of memory cells to the N foggy states, identify slower and faster programming memory cells for each foggy state of at least N−1 of the foggy states and slowing programming of the faster programming memory cells; and program the set of memory cells from the N foggy states and an erased state to N+1 final states.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a set of memory cells, to perform a program operation for the set of memory cells, the control circuit is configured to:
apply a plurality of program pulses to the set of memory cells in a corresponding plurality of program loops, each memory cell of the set of memory cells is configured to be programmed to a corresponding foggy state of a plurality of foggy states;
in a first checkpoint program loop of the plurality of program loops, classify memory cells programmed to a corresponding foggy state into at least slower and faster memory cells; and
in a first next program loop after the first checkpoint program loop, apply a program pulse to the set of memory cells while applying an inhibit bit line voltage to the faster memory cells and a first program speed-reducing bit line voltage to the slower memory cells.

2. The apparatus of claim 1, wherein:
in the first checkpoint program loop, the memory cells programmed to the corresponding foggy state are classified into slower, medium speed and faster memory cells; and
in the first next program loop after the first checkpoint program loop, while the program pulse is applied to the set of memory cells, the control circuit is configured to apply a second program speed-reducing bit line voltage to the medium speed memory cells, wherein the first program speed-reducing bit line voltage is less than the second program speed-reducing bit line voltage.

3. The apparatus of claim 1, wherein:
in the first checkpoint program loop, the control circuit is configured to classify memory cells configured to be programmed to a next foggy state which is higher than the corresponding foggy state of the first checkpoint program loop into at least slower and faster memory cells; and
in a second next program loop after the first next program loop, while applying the program pulse to the set of memory cells, the control circuit is configured to apply an inhibit bit line voltage to the faster memory cells configured to be programmed to the next foggy state and a program speed-reducing bit line voltage to the slower memory cells configured to be programmed to the next foggy state.

4. The apparatus of claim 3, wherein:
in the first next program loop after the first checkpoint program loop, while applying the program pulse to the set of memory cells, the control circuit is configured to apply a normal speed bit line voltage to memory cells configured to be programmed to the next foggy state.

5. The apparatus of claim 3, wherein:
in the first next program loop after the first checkpoint program loop, while applying the program pulse to the set of memory cells, the control circuit is configured to apply an inhibit bit line voltage to memory cells in one or more foggy states below the corresponding foggy state of the first checkpoint program loop.

6. The apparatus of claim 1, wherein:
the control circuit is configured to optimize a magnitude of an initial program pulse of the plurality of program pulses based on a prior program operation.

7. The apparatus of claim 1, wherein:
the set of memory cells is connected to a word line among a plurality of word lines arranged at different heights above a substrate; and
the control circuit is configured to optimize a magnitude of an initial program pulse of the plurality of program pulses based on the height.

8. The apparatus of claim 1, wherein:
in a second checkpoint program loop of the plurality of program loops, classify memory cells programmed to a corresponding foggy state into at least slower and faster memory cells; and
in a next program loop after the second checkpoint program loop, apply a program pulse to the set of memory cells while applying an inhibit bit line voltage to the faster memory cells which were classified in the second checkpoint program loop and a program speed-reducing bit line voltage to the slower memory cells which were classified in the second checkpoint program loop.

9. The apparatus of claim 8, wherein:
in the first checkpoint program loop of the plurality of program loops, the control circuit is configured to classify memory cells configured to be programmed to corresponding foggy states ranging from the corresponding foggy state of the first checkpoint program loop to one foggy state below the corresponding foggy state of the second checkpoint program loop, into at least slower and faster memory cells, but not classify memory cells configured to be programmed to corresponding foggy states ranging from the corresponding foggy state of the second checkpoint program loop to a highest foggy state of the plurality of foggy states, into at least slower and faster memory cells.

10. The apparatus of claim 8, wherein:
the program speed-reducing bit line voltage in the first next program loop after the first checkpoint program loop is different than the program speed-reducing bit line voltage in the next program loop after the second checkpoint program loop.

11. The apparatus of claim 8, wherein:
a step size for a program pulse in the first next program loop after the first checkpoint program loop is different than a step size for the next program loop after the second checkpoint program loop.

12. A method, comprising:
in a first pass of a program operation, performing a plurality of program loops for a set of memory cells, the plurality of program loops are configured to program the set of memory cells to a corresponding plurality of foggy states, and each memory cell of the set of memory cells is configured to be programmed to a corresponding foggy state of the plurality of foggy states;

in a first checkpoint program loop of the plurality of program loops, classify memory cells programmed to a corresponding foggy state into at least slower and faster memory cells;

in a first next program loop after the first checkpoint program loop, while applying a program pulse to the set of memory cells, applying an inhibit bit line voltage to the faster memory cells and a program speed-reducing bit line voltage to the slower memory cells; and perform a second pass of the program operation, the performing the second pass comprising programming each memory cell of the set of memory cells from the corresponding foggy state to a corresponding final state.

13. The method of claim 12, wherein:

in a second checkpoint program loop of the plurality of program loops, classify memory cells programmed to a corresponding foggy state into at least slower and faster memory cells; and in a next program loop after the second checkpoint program loop, while applying a program pulse to the set of memory cells, applying an inhibit bit line voltage to the faster memory cells which were classified in the second checkpoint program loop and applying a program speed-reducing bit line voltage to the slower memory cells which were classified in the second checkpoint program loop.

14. The method of claim 12, further comprising:

in the first checkpoint program loop, classifying memory cells configured to be programmed to a next foggy state which is higher than the corresponding foggy state of the first checkpoint program loop into at least slower and faster memory cells; and in a second next program loop after the first next program loop, while applying a program pulse to the set of memory cells, applying an inhibit bit line voltage to the faster memory cells configured to be programmed to the next foggy state and a program speed-reducing bit line voltage to the slower memory cells configured to be programmed to the next foggy state.

15. The method of claim 14, further comprising:

in the first next program loop after the first checkpoint program loop, while applying the program pulse to the set of memory cells, applying a normal speed bit line voltage to the memory cells configured to be programmed to the next foggy state.

16. An apparatus, comprising:

a control circuit configured to connect to a set of memory cells; and a memory interface connected to the control circuit, the control circuit is configured to issue commands via the memory interface to:

program the set of memory cells to a number of foggy states using a number of program pulses that is equal to the number of foggy states;

during the programming of the set of memory cells to the foggy states, identify slower and faster programming memory cells for one or more of the foggy states and slowing programming of the faster programming memory cells; and program the set of memory cells from the foggy states and an erased state to a number of final states that is one more than the number of foggy states.

17. The apparatus of claim 16, wherein:

the program pulses are applied in a plurality of program loops; and the identifying of the slower and faster programming memory cells is performed in one or more checkpoint program loops of the plurality of program loops.

18. The apparatus of claim 17, wherein:

the one or more checkpoint program loops comprise a number of checkpoint program loops that is no more than half the number of foggy states.

19. The apparatus of claim 17, wherein:

the one or more checkpoint program loops are equally spaced among the program loops.

20. The apparatus of claim 17, wherein:

the one or more checkpoint program loops are unequally spaced among the program loops.

* * * * *